United States Patent
Higeta et al.

(10) Patent No.: US 8,549,366 B2
(45) Date of Patent: Oct. 1, 2013

(54) MEMORY REFRESHING CIRCUIT AND METHOD FOR MEMORY REFRESH

(75) Inventors: Masanori Higeta, Kawasaki (JP); Kenji Suzuki, Kawasaki (JP); Takatsugu Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 398 days.

(21) Appl. No.: 12/683,059

(22) Filed: Jan. 6, 2010

(65) Prior Publication Data

US 2010/0106901 A1    Apr. 29, 2010

Related U.S. Application Data

(63) Continuation of application No. PCT/JP2007/064199, filed on Jul. 18, 2007.

(51) Int. Cl.
   *G06F 11/00* (2006.01)
   *G11C 29/00* (2006.01)

(52) U.S. Cl.
   USPC .............. 714/718; 714/42; 714/48; 714/704

(58) Field of Classification Search
   USPC ..................................... 714/704, 718, 42, 48
   See application file for complete search history.

(56) References Cited

U.S. PATENT DOCUMENTS

| | | | | |
|---|---|---|---|---|
| 4,964,129 A | * | 10/1990 | Bowden et al. | 714/764 |
| 6,560,725 B1 | * | 5/2003 | Longwell et al. | 714/54 |
| 2002/0004921 A1 | | 1/2002 | Muranaka et al. | |
| 2004/0205426 A1 | * | 10/2004 | Muranaka et al. | 714/704 |
| 2007/0022244 A1 | | 1/2007 | Kimmery | |
| 2007/0250283 A1 | * | 10/2007 | Barnum et al. | 702/117 |
| 2008/0313509 A1 | * | 12/2008 | Bose et al. | 714/704 |

FOREIGN PATENT DOCUMENTS

| | | |
|---|---|---|
| EP | 0 212 547 B1 | 1/1992 |
| JP | 56-165989 A | 12/1981 |
| JP | 4-60988 A | 2/1992 |
| JP | 2002-25299 A | 1/2002 |
| JP | 2007-35035 A | 2/2007 |
| WO | WO 96/28825 A1 | 9/1996 |

OTHER PUBLICATIONS

Hellebrand, S. et al., "Error Detecting Refreshment for Embedded DRAMs", Proceedings 17th IEEE VLSI Test Symposium (CAT. No. PR00146), 1999, pp. 384-390.

* cited by examiner

*Primary Examiner* — Yolanda L Wilson
(74) *Attorney, Agent, or Firm* — Arent Fox LLP

(57) ABSTRACT

The optimization of a refresh cycle is carried out in harmony with the error occurrence state in the memory with the presence of a normal patrol controlling section controlling a normal patrol operation that patrols the memory; an additional patrol controlling section controlling an additional patrol operation that patrols, if a first error in the memory is detected during the normal patrol operation, an error occurring area in which the first error occurs and which is included in the memory; a measuring section (15) measuring, if a second error is detected in the error occurring area during the additional patrol operation, an error frequency representing information of error in the error occurring area; and a refresh cycle adjusting section adjusting the refresh cycle in accordance with the error frequency measured by the measuring section.

18 Claims, 18 Drawing Sheets

MEMORY REFRESHING CIRCUIT AND METHOD FOR MEMORY REFRESH

CROSS-REFERENCE TO RELATED APPLICATION

This application is a continuation Application of a PCT international application No. PCT/JP2007/064199 filed on Jul. 18, 2007 in Japan, the entire contents of which are incorporated by reference.

FIELD

The present embodiment relates to a technique of carrying out memory refresh at a refresh cycle of a memory.

BACKGROUND

The recent enhancement in the capability of computers makes the loss of time and power consumption when refreshing a memory, such as a DRAM (Dynamic Random Access Memory), unnegligible. Under the above circumstance, the refresh cycle is controlled such that the memory refresh is carried out at a long cycle in a state in which error (data error) occurs less while being carried out a short cycle in a state in which errors easily occur.

FIG. 18 is a diagram schematically depicting an example of a conventional operation manner to control a memory refresh cycle. The conventional operation manner of controlling a memory refresh controls the memory refresh cycle by monitoring error in a memory 91 through the use of a memory refresh circuit 90, as depicted in FIG. 18. For example, the memory refresh circuit 90 of FIG. 18 is configured to include a memory controller 92, an ECC (Error Correcting Code) circuit 93, an error rate monitor 94, a refresh cycle creating section 95, a refresh request creating section 96, and an external interface 97.

The memory controller 92 controls access to the memory 91, and, for example, carries out memory refresh and reads data from the memory 91 when data access is carried out.

The ECC circuit 93 generates, when writing data into the memory 91 under the control of the memory controller 92, an error detection/correction code (checking code) based on the data to be written, attaches the code to the data and writes the data into the memory 91. For example, when data is read from the memory 91 by the memory controller 92, the ECC circuit 93 checks validity of the data through use of the read data and the corresponding error detection/correction code and, if a correctable error is detected as an error, the error in the data is corrected. Then, the ECC circuit 93 notifies the presence/absence of error to the error rate monitor 94.

The error rate monitor 94 holds an amount of error occurrence, and for example, counts the "error number" (amount of error occurrence) on the basis of the presence/absence of errors notified by the ECC circuit 93. For example, the error rate monitor 94 holds a variable representing the "error number", and decreases a predetermined value from the held number of errors when no error occurs while adding a predetermined values to the held "error number" when an error occurs.

The refresh cycle creating section 95 generates a refresh cycle. For example, the refresh cycle creating section 95 compares "error number" held by the error rate monitor 94 and a predetermined reference value (error rate), and shortens the refresh cycle when "error number" exceeds the reference value while lengthening the refresh cycle when "error number" is lower than the reference value.

The refresh request creating section 96 requests the memory controller 92 to carry out a refresh operation at the refresh cycle created by the refresh cycle creating section 95.

The external interface 97 carries out interface control of the processor of the information processing apparatus (not illustrated) incorporating therein the memory refreshing circuit 90 with an upper unit including another controller, and carries out interface control exemplified by reception of a read command or a write command from a processor, reply to the processor with read data, and transmission of memory status information to the processor.

Accordingly, in the conventional manner of controlling the memory refresh cycle, the ECC circuit 93 first of all detects an error in the memory 91 on the basis of the data that the memory controller 92 has read from the memory 91. Here, "error number" held by the error rate monitor 94 decreases when the ECC circuit 93 detects no error while increasing when the ECC circuit 93 detects an error. Then, when "error number" becomes lower than the reference value, the refresh cycle is adjusted to be longer and when the number of errors becomes more than the referenced value, the refresh cycle is adjusted to be shorter.

The Patent Reference 1 below discloses a technique in which an ECC circuit reads a number of data pieces and corresponding check bits at a regular refresh cycle, carries out error detection and correction, accumulates a first detection signal representing absence of errors, accumulates a second detection signal representing presence of errors which signal has a larger weight than that of the first detection signal so as to reduce the first amount of accumulation, and lengthens the refresh cycle when the accumulated amount exceeds a predetermined amount while shortening the refresh cycle when the accumulated amount comes to be lower than the predetermined amount.

Further, the Patent Reference 2 discloses a technique in which a refresh cycle is lengthened until an ECC circuit detects a correctable error, the optimum refresh cycle is set for each block, and the refresh cycle of an unused region is set to be infinity (i.e., no refresh operation is carried out on the region).

[Patent Reference 1] Japanese Patent Application Laid-Open (KOKAI) Publication No. 2002-025299
[Patent Reference 2] Pamphlet of WO96/28825

However, the above conventional operation manner of controlling a memory refresh frequency and the above Patent References 1 and 2 have to always detect an error in the entire memory. For this reason, in detection of an error occurring locally such as in a case where errors occur in some of the addresses in the memory, it takes long time a problem of low responsiveness to arise when the operational environment of the system temporarily varies.

In particular, since the Patent References 1 and 2 are technique of control predicted on control in the stand-by mode of the memory, the refresh cycle can be modified only in the stand-by mode, but cannot be dynamically modified during a normal operation. This causes a problem that the refresh cycle cannot be adjusted in harmony with the state of error occurrence in the memory.

SUMMARY

According to an aspect of the invention, the memory refreshing apparatus of the present embodiment refreshes a memory at a refresh cycle, and includes: a normal patrol controlling section controlling a normal patrol operation that patrols the memory; an additional patrol controlling section controlling an additional patrol operation that patrols, if a first error in the memory is detected during the normal patrol operation performed by the normal patrol controlling section, an error occurring area in which the first error has occurred; a measuring section measuring, if a second error is detected in the error occurring area during the additional patrol operation performed by the additional patrol controlling section, an error frequency representing information of error in the error occurring area; and a refresh cycle adjusting section adjusting the refresh cycle in accordance with the error frequency measured by the measuring section.

Preferably, the refresh cycle adjusting section stepwisely shortens the refresh cycle if the error frequency measured by the measuring section increases while stepwisely lengthening the refresh cycle if the error frequency measured by the measuring section decreases.

Further preferably, the measuring section measures, as the error frequency, the number of errors in the error occurring area per predetermined time period.

If a plurality of the error occurring areas are detected during the additional patrol operation performed by the additional patrol controlling section, the measuring section may measure, as the error frequency, the number of the error occurring areas.

In addition, the refresh cycle adjusting section may adjust the refresh cycle to a predetermined lower limit or more.

Further, the refresh cycle adjusting section may vary the lower limit on the basis of an access frequency to the memory, and may vary the lower limit on the basis of memory temperature representing the temperature of the memory.

Still further, the refresh cycle adjusting section may reset the refresh cycle to a default value when an elapsed time passing since the first error is detected in the normal patrol operation performed by the normal patrol controlling section exceeds a predetermined time period.

Still further, the memory refreshing apparatus may further include a monitoring interval varying section varying a monitoring interval of the additional patrol operation on the basis of the refresh cycle adjusted by the refresh cycle adjusting section.

Still further, the monitoring interval varying section may lengthen the monitoring interval when the error frequency measured by the measuring section becomes constant.

The method for refreshing a memory of the present embodiment refreshes a memory at a refresh cycle and includes the steps of: controlling a normal patrol operation that patrols the memory; controlling an additional patrol operation that patrols, if a first error in the memory is detected during the normal patrol operation performed in the normal patrol controlling step, an error occurring area in which the first error has occurred; measuring, if a second error is detected in the error occurring area during the additional patrol operation performed in the additional patrol controlling step, an error frequency representing information of error in the error occurring area; and adjusting the refresh cycle in accordance with the error frequency measured in the measuring step.

Preferably, in the refresh cycle adjusting step, the refresh cycle is stepwisely shortened if the error frequency measured in the measuring step increases while the refresh cycle is stepwisely lengthened if the error frequency measured in the measuring step decreases.

Further preferably, in the measuring step, the number of errors in the error occurring area per predetermined time period is measured as the error frequency.

In addition, if a plurality of the error occurring areas are detected during the additional patrol operation performed in the additional patrol controlling step, the number of the error occurring areas may be measured as error frequency in the measuring step.

Further, in the refresh cycle adjusting step, the refresh cycle may be adjusted to a predetermined lower limit or more.

Still further, in the refresh cycle adjusting step, the lower limit may be varied on the basis of an access frequency to the memory, and in the refresh cycle adjusting step, the lower limit may be varied on the basis of memory temperature representing the temperature of the memory.

Still further, in the refresh cycle adjusting step, the refresh cycle may be reset to a default value when an elapsed time passed since the first error has been detected in the normal patrol operation performed in the normal patrol controlling step exceeds a predetermined time period.

Still further, the method may further include the step of varying a monitoring interval of the additional patrol operation on the basis of the refresh cycle adjusted in the refresh cycle adjusting step.

Still further, in the monitoring interval varying step, the monitoring interval may be lengthened when the error frequency measured by the measuring section becomes constant.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Hereinafter, a present embodiment will now be described with reference to the accompanying drawings.

Figure 1:
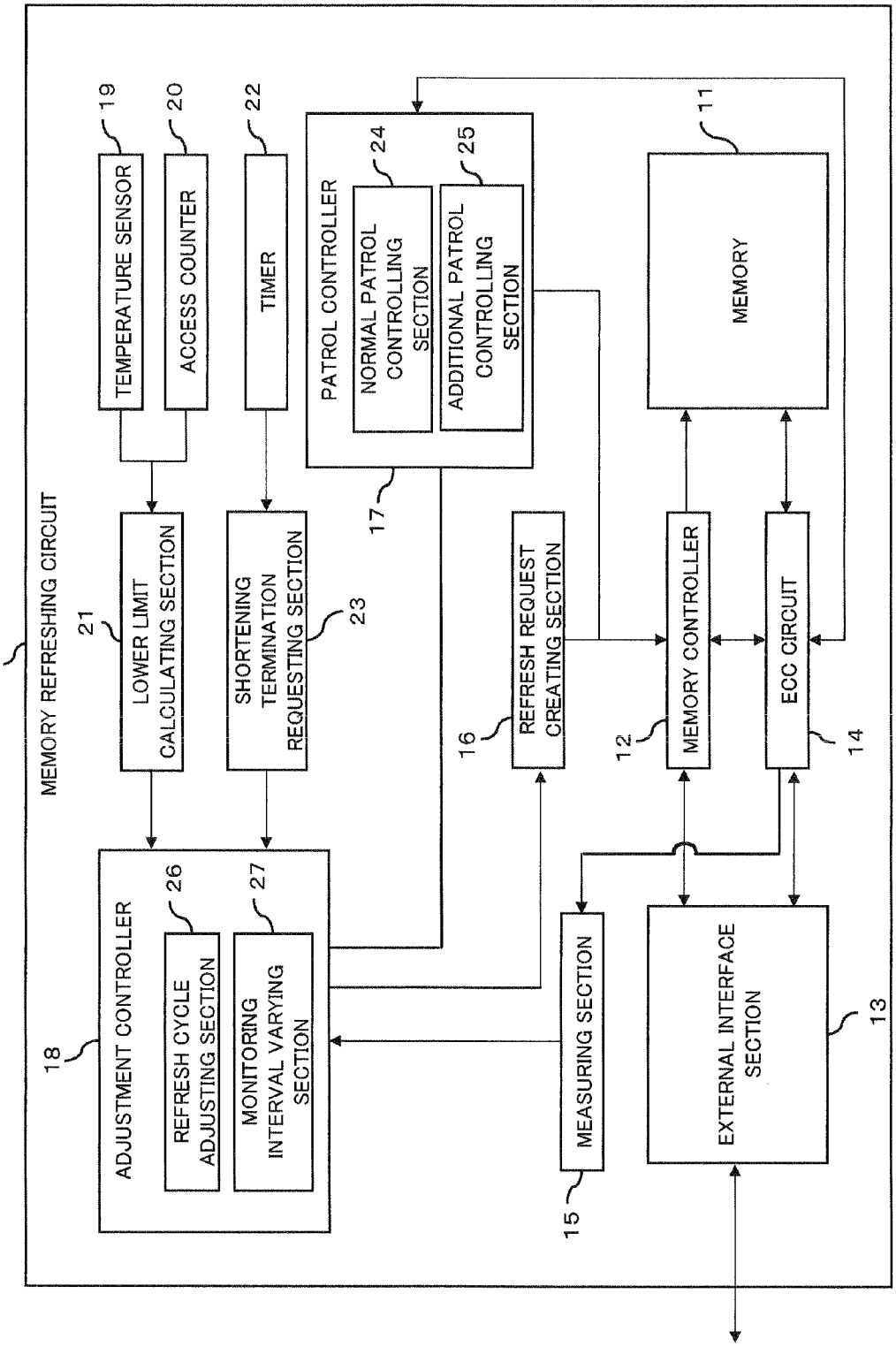
FIG. 1 A diagram schematically depicting an example of the configuration of a memory refresh circuit according to a first embodiment.
Figure 2:
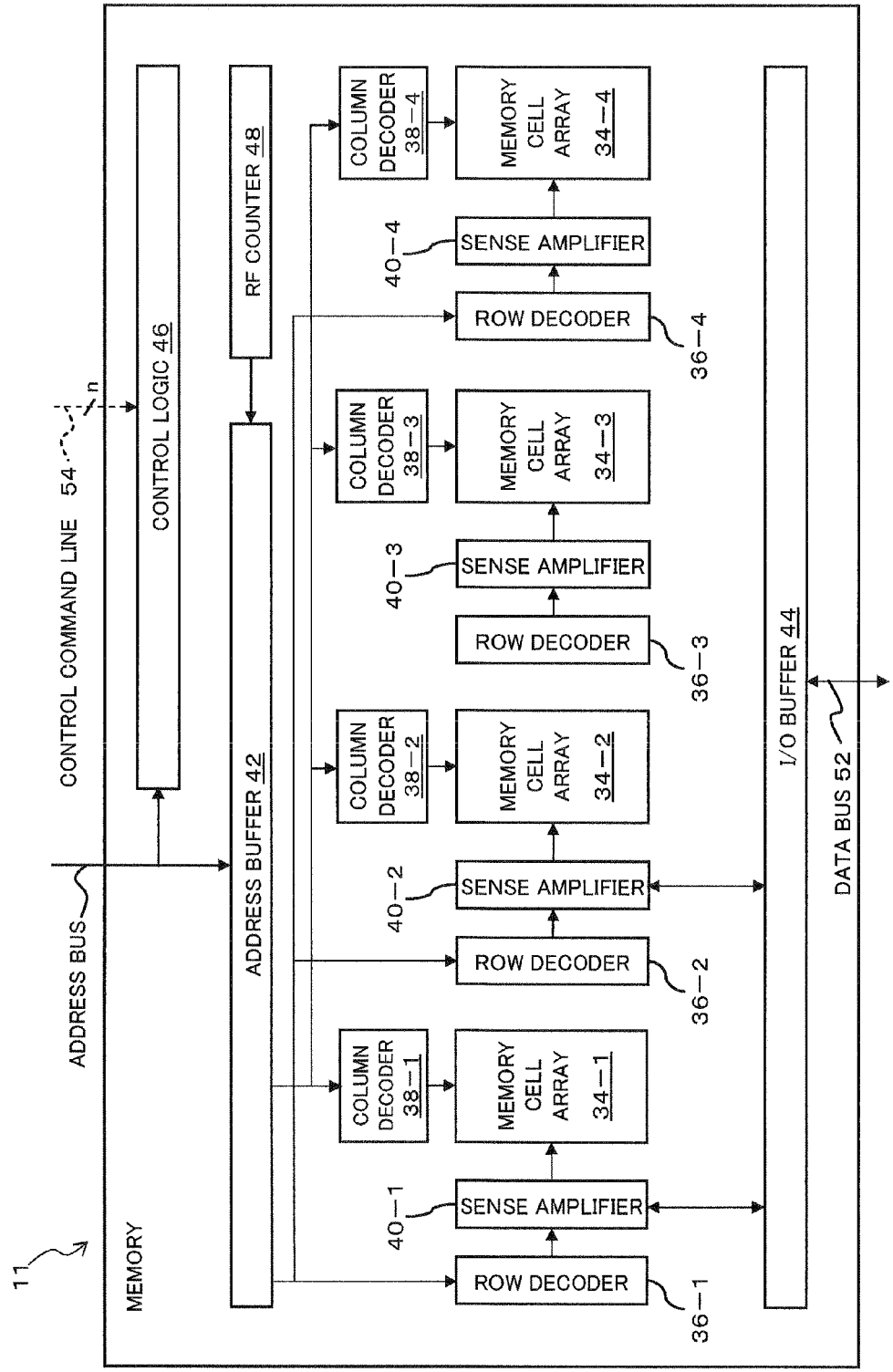
FIG. 2 A diagram schematically depicting an example of the configuration of a memory in the memory refresh circuit of the first embodiment.

(1) Description of the First Embodiment:

FIG. 1 is a diagram schematically depicting an example of the configuration of a memory refresh circuit according to a first embodiment, and FIG. 2 is a diagram schematically depicting an example of the configuration of a memory in the memory refresh circuit.

A memory refreshing circuit (a memory refreshing apparatus) 10 according to the first embodiment refreshes a memory 11 at a refresh cycle, and is configured to be a circuit including, as depicted in FIG. 1, the memory 11, a memory controller 12, an external interface section 13, an ECC (Error Control Code) circuit 14, a measuring section 15, a refresh request creating section 16, a patrol controller 17, an adjustment controller 18, a temperature sensor 19, an access counter 20, a lower limit calculating section 21, a timer 22, and a shortening termination requesting section 23. The memory refreshing circuit 10 is included in, for example, a memory board (not illustrated) mounted in an information processing apparatus such as a PC (Personal Computer).

The memory 11 is a memory device such as a DRAM (Dynamic Random Access Memory) or SDRAM (Static Random Access Memory), and is exemplified by MICRON Ltd. Product DDR2 SDRAM.

The memory 11 is in the form of, for example, memory cell arrays having four banks, as depicted in FIG. 2, and includes four memory cell arrays 34-1, 34-2, 34-3, and 34-4. The memory cell arrays 34-1 through 34-4 have respective row decoders 36-1 through 36-4, column decoders 38-1 through 38-4, and sense amplifiers 40-1 through 40-4.

For the row decoders 36-1 through 36-4 and the column decoders 38-1 through 38-4, an address buffer 42 is provided so that a row address and a column address designated by the memory controller 12 (see FIG. 1) through an address bus 50 are decoded, and a write operation and a read operation are carried out through an access to the corresponding data in the memory in, for example, minimum units of a word (8 bits).

For the above, for the sense amplifiers 40-1 through 40-4, an I/O buffer 44 is provided which is coupled to a data bus 52 from the external interface section 13 (see FIG. 1) via the ECC circuit 14 (see FIG. 1).

There are provided an RF counter (refresh counter) 48 and a control logic 46 in the memory 11. The RF counter 48 counts time until the next refresh is carried out since a refresh has been carried out.

To the control logic 46, the address bus 50 from the memory controller 12 and the control command line 54 are input. The control logic 46 controls the driving of the memory 11 on the basis of a control command signal based on the control command line 54. The main control operations in controlling the driving of the memory 11 by the control logic 46 are a write operation, a read operation, a refresh operation, and a patrol operation. As an example of a control command, when the control logic 46 receives a refresh command from the memory controller 12, column addresses of the memory cell arrays 34-1 through 34-4 determined by the RF counter 48 are successively designated and a single-time of refresh is carried out.

Here, the number of rows of each of the four memory cell arrays 34-1 through 34-4 is 8,192 rows, and refresh is carried out concurrently on the four banks. Therefore, upon receipt of a single-time refresh command, the RF counter 48 successively creates row addresses for 8,192 rows and carries out a refresh operation on all the memory devices (cells) included in the memory cell arrays 34-1 through 34-4.

The cycle of a refresh operation of successive creation of 8,192 row addresses is, for example, 64 ms and accordingly, the refresh cycle per row address is 7.8125 is.

The refresh operation to be carried out on memory devices (not illustrated) included in the 34-1 through 34-4 is the same as the operation procedure of a read operation from which data output is excluded as follows.

(1) Turning on a precharge switch (not illustrated), so that an internal data line (not illustrated) is prompted to have the same voltage as the voltage (sense amplifier threshold voltage) of a precharge power source line (not illustrated);

(2) Turning off the precharge switch, and at this time, the internal data line maintains the precharged voltage due to the parasitic capacity;

(3) Selecting a word line (not illustrated) and providing a voltage thereto, so that the source and the drain of the FET in a memory device are conducted and data of a capacitor (not illustrated) appears in the internal data line, and at this time, since the internal data line has the precharge voltage (threshold voltage), the voltage of the internal data line becomes higher than the threshold voltage when data 1 that means that the capacitor has charge while the voltage is lower than the threshold voltage when data 0 that means that the capacitor has no charge; and (4) Operating the sense amplifiers 40-1 through 40-4, so that the voltage of the internal line is converted to voltages corresponding to "0" and "1" on the basis of the threshold voltage, the converted voltage is output, and the same data is stored again into the capacitors in the memory devices.

The memory controller 12 controls accesses to the memory 11, as depicted in FIG. 1, and outputs a control command signal at, for example, a timing determined by a memory device used as the memory 11 and thereby controls data writing into and data reading from the memory 11, a refresh operation and a patrol operation.

The memory controller 12 carries out a normal refresh mode in which the refresh operation on the memory 11 is controlled at a refresh cycle predetermined on the basis of the specification of the memory 11, and a refresh cycle shortening mode in which the refresh operation on the memory 11 is controlled at a refresh cycle adjusted by the refresh cycle adjusting section 26 that is to be detailed below.

Further, the memory controller 12 carries out, under control of the normal patrol controlling section 24 that is to be detailed below, a normal patrol operation in which the entire memory 11 is patrolled (error patrol, memory patrol) at predetermined monitoring intervals (normal monitoring intervals). Specifically, the memory controller 12 regularly scans all the addresses of the memory 11 at the normal monitoring intervals and reads data of the addresses in the normal patrol operation.

In addition, in the event of detection of an error in the memory 11 during the normal patrol operation based on the control of the normal patrol controlling section 24 that is to be detailed below, the memory controller 12 carries out, under the control of the additional patrol controlling section 25 that is to be detailed below, an additional patrol operation in which an error occurring address (error occurring area) at which the error occurs is patrolled. Specifically, when the ECC circuit 14 detects, as an error, a correctable data error, the memory controller 12 carries out the additional patrol operation that intensively patrols the error occurring address at monitoring intervals (addition monitoring intervals) sufficiently shorter than the normal monitoring intervals.

In addition, the memory controller 12 in the first embodiment controls the normal patrol operation with the use of an entire PT counter (not illustrated) which counts time until the next normal patrol operation is to be carried out since a normal patrol operation has been carried out, and controls the additional operation with the use of an additional PT counter (not illustrated) which counts time until the next additional operation is to be carried out since an additional patrol operation has been carried out, and a PT number counter (not illustrated) which counts the number of times that the additional patrol is carried out.

The entire PT counter, the additional PT counter, and the PT number counter are realized by a known method and the detailed description thereof is omitted. A specific processing procedure entailing the use of the entire PT counter, the additional PT counter, and the PT number counter will be detailed below.

The external interface section 13 carries out interface control of the processor of the information processing apparatus (not illustrated) incorporating therein the memory refreshing circuit 10 with an upper unit including another controller, and carries out interface control exemplified by reception of a read command or a write command from a processor, reply to the processor with read data, and transmission of memory status information to the processor.

The ECC circuit 14 generates, when writing data into the memory 11 under the control of the memory controller 12, an error detection/correction code (checking code) based on the data to be written, attaches the code to the data and writes the data into the memory 11. For example, when data is read from the memory 11 during the normal patrol operation and the additional patrol operation performed by the memory controller 12, validity of the data is checked through the use of the read data and the corresponding error detection/correction code and, if a correctable error is detected as an error, the error in the data is corrected.

In the present embodiment, the ECC circuit 14 uses, for example, a single-error-correction double-error-detection code as the error detection/correction code. Therefore, when a single error is detected in the read data, the ECC circuit 14 judges that the detected error is a correctable error and corrects the error while when a double or more error is detected, the ECC circuit 14 judges that the detected error is uncorrectable and informs the error as a system failure to the processor functioning the upper unit through the external interface section 13.

The measuring section 15 measures, as an error frequency, information of error at an error occurring address when an error is detected during the additional patrol operation by the additional patrol controlling section 25, in other words, when the ECC circuit 14 detects a correctable error as the error. For example, the measuring section 15 measures, as the error frequency, the number of errors occurring at an error occurring address per predetermined time period.

Then, the measuring section 15 informs the adjustment controller 18 that is to be detailed below of the measured error frequency.

The refresh request creating section 16 outputs a trigger signal to generate a refresh command to the memory controller 12. Upon receipt of the trigger signal, the memory controller 12 issues a refresh command to the memory 11 to cause the memory 11 to carry out a refresh operation.

The patrol controller 17 controls data checking (memory patrol) by regularly reading data in the memory 11, and includes the normal patrol controlling section 24 and the additional patrol controlling section 25 as depicted in FIG. 1.

The normal patrol controlling section 24 controls the above normal patrol operation and the additional patrol controlling section 25 controls the above additional patrol operation.

Figure 3:
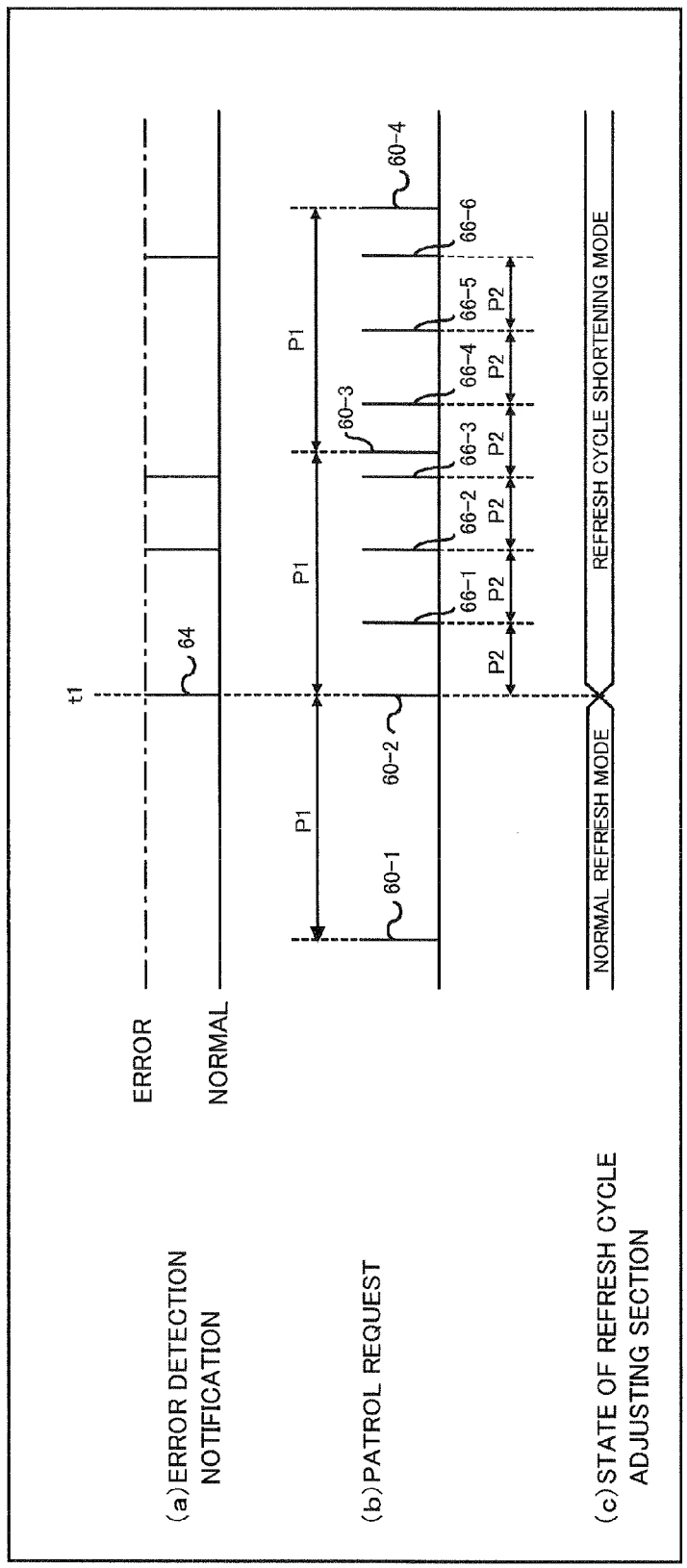
FIG. 3(a) through (c) are timing charts denoting an example of issuing patrol requests from a normal patrol section and additional patrol section in the memory refresh circuit of the first embodiment.
Figure 4:
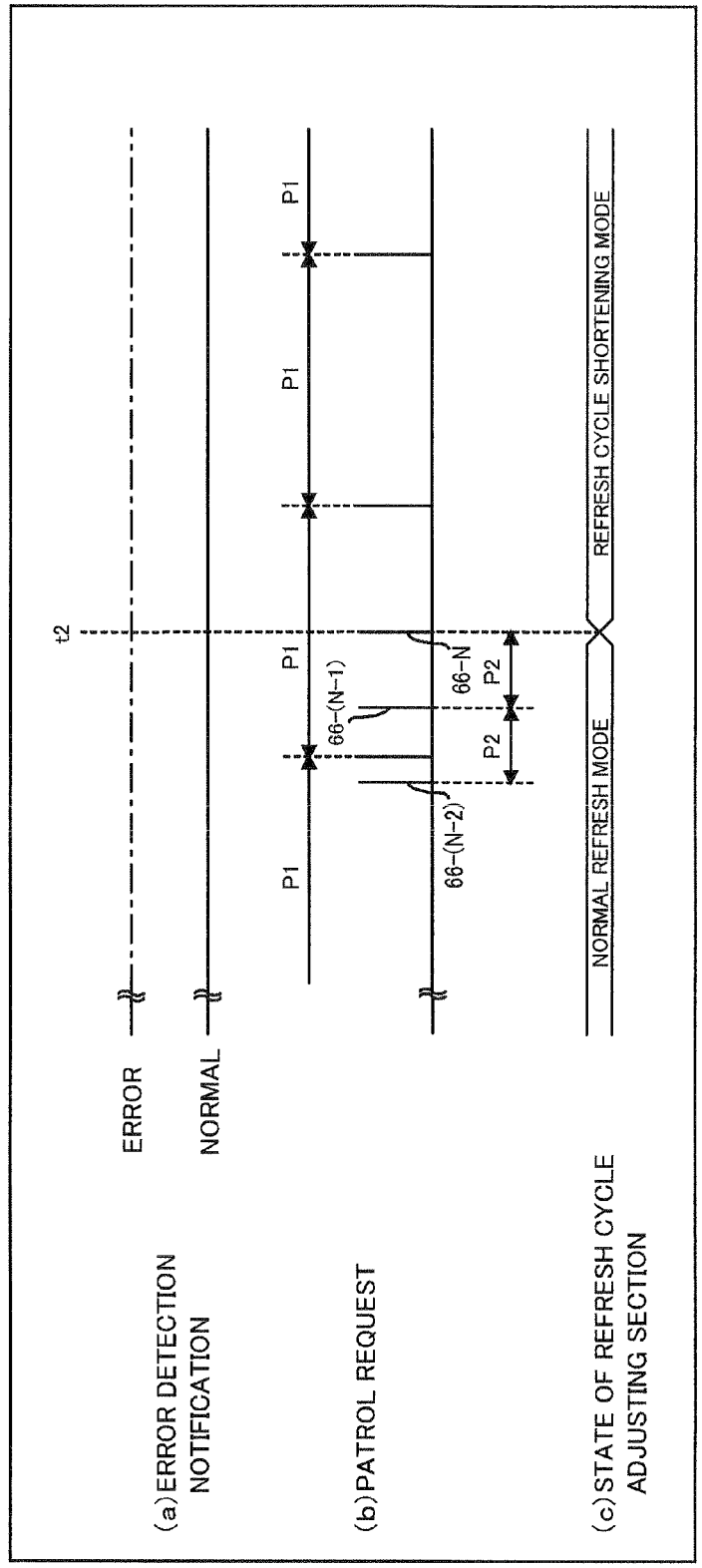
FIG. 4(a) through (c) are timing charts denoting an example of issuing patrol requests from a normal patrol section and additional patrol section in the memory refresh circuit of the first embodiment.

FIGS. 3 and 4 denote timing charts of examples of controlling a patrol operation by the memory controller 12 in the memory refresh circuit of the first embodiment: FIGS. 3(a) and 4(a) denote error detection notification of the ECC circuit 14; and FIGS. 3(b) and 4(b) denote issue of patrol requests of the patrol controller 17; FIGS. 3(c) and 4(c) denote operational states of a refresh cycle adjusting section 26 that is to be detailed later.

In the example denoted in 3(a) through (c), the normal patrol controlling section 24 outputs normal patrol trigger signals 60-1 through 60-4 to the memory controller 12 at normal monitoring intervals "P1" during the normal patrol operation as denoted in FIG. 3(b). The memory controller 12 receives normal patrol trigger signals 60-1 through 60-4, and responsively issues normal patrol commands to the memory 11 to control the normal patrol operation.

while in this state, if the ECC circuit 14 detects a correctable single error in read data from the memory 11 at, for example, the time t1, the adjustment controller 18 receives an error detection notification of FIG. 3(a), and receives and holds the error occurring address in which the single error has been detected.

Further, as denoted in FIG. 3(c), the refresh cycle adjusting section 26 receives the error detection notification 64 of FIG. 3(a) and shifts to a refresh cycle shortening mode in which adjustment of the refresh cycle is repeated.

Then, upon receipt of the error detection notification 64 of the single error at the time t1, the adjustment controller 18 issues an additional patrol request for the error occurring address to the additional patrol controlling section 25.

For this reason, after the time t1, the additional patrol controlling section 25, which has received the additional patrol request, issues additional patrol trigger signals 66-1 through 66-6 corresponding to the additional patrol request at additional monitoring intervals "P2" shorter than the normal monitoring interval "P1" in addition to the normal patrol trigger signals 60-1 through 60-4 issued at the normal monitoring interval "P1".

Upon receipt of the additional patrol trigger signals 66-1 through 66-6, the memory controller 12 issues an additional patrol command, designating the error occurring address, to the memory 11. As a consequence, the additional patrol operation is carried out on the error occurring address and the effect of reduction in error occurring frequency of the error occurring address resulting from the refresh operation performed at refresh cycle adjusted by the refresh cycle adjusting section 26 that is to be detailed below.

Control of the additional patrol operation by the memory controller 12 from the time t1 is carried out until the refresh cycle shortening mode of the refresh cycle adjusting section 26 is cancelled as depicted in FIGS. 4(a) through (c). The condition to cancel the refresh cycle shortening mode will be detailed below.

The adjustment controller 18 adjusts the refresh cycle on the basis of the error frequency measured by the measuring section 15, concurrently varies the monitoring interval over the memory 11, and includes a refresh cycle adjusting section 26 and a monitoring interval varying section 27, as depicted in FIG. 1.

The refresh cycle adjusting section 26 adjusts the refresh cycle in accordance with the error frequency measured by the measuring section 15. For example, when the error frequency measured by the measuring section 15 increases, the refresh cycle adjusting section 26 stepwisely shortens the refresh cycle while, when the error frequency measured by the measuring section 15 decreases, the refresh cycle adjusting section 26 stepwisely lengthens the refresh cycle. In other words, the refresh cycle adjusting section 26 adjusts the degree of shortening of the refresh cycle in accordance with the error frequency.

Figure 5:
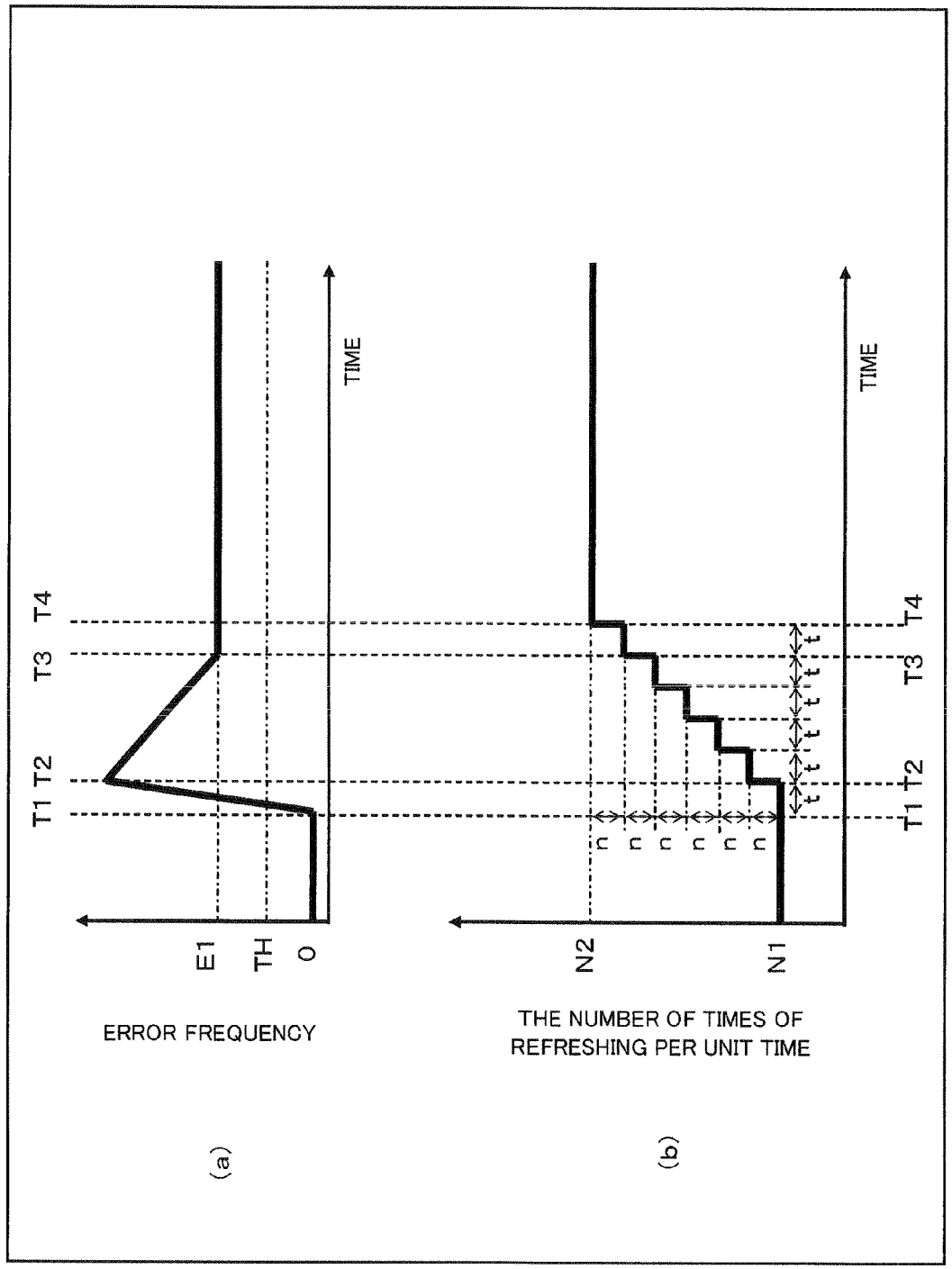
FIGS. 5(a) and (b) are timing charts denoting an example of adjustment of a refresh cycle by a refresh cycle adjusting section in the memory refresh circuit of the first embodiment.
Figure 6:
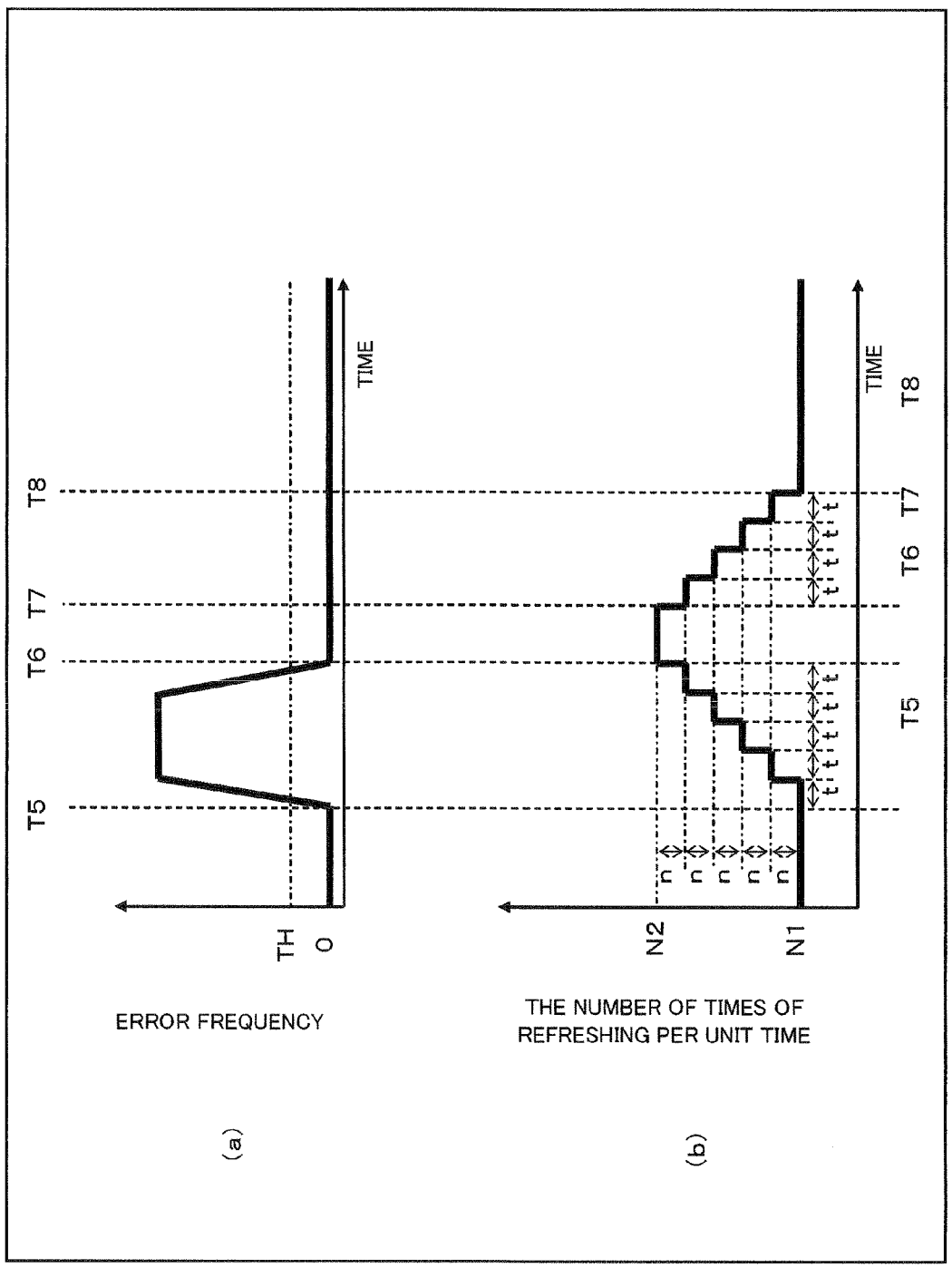
FIGS. 6(a) and (b) are timing charts denoting an example of adjustment of a refresh cycle by a refresh cycle adjusting section in the memory refresh circuit of the first embodiment.

FIGS. 5 and 6 are timing charts denoting examples of adjustment of the refresh cycle by the refresh cycle adjusting section in the memory refreshing circuit according to the first embodiment: FIGS. 5(a) and (b) denote a case where even shortening the refresh cycle does not resolve the error frequency while FIGS. 6(a) and (b) denote a case where shortening the refresh cycle resolve the error frequency.

FIGS. 5(a) and 6(a) denote variations in error frequency in chronological order, and the ordinates and the abscissas thereof represent error frequency and time, respectively. Further, FIGS. 5(b) and 6(b) denote variation in refresh frequency in chronological order, and the ordinates and the abscissas thereof represent the number of times of refresh per unit time and time, respectively.

Increase in the number of times of refresh per unit time means shortening of the refresh cycle.

Specifically, the refresh cycle adjusting section 26 repeats the adjustment of the refresh cycle at a cycle (e.g., see the time "t" in FIG. 5(b)) of, for example, once in 10 times of refreshing the memory 11. Here, when a correctable error is detected by the ECC circuit 14, the refresh cycle adjusting section 26 shifts to the refresh cycle shortening mode. In the refresh cycle shortening mode, each time the adjustment is carried out (see the time "t" in FIG. 5(b)), a predetermined unit number of times (e.g., see the symbol "n" in FIG. 5(b)) is added to the number of times of refresh per unit time, so that the refresh cycle is reduced by a predetermined unit frequency "cn". When the error frequency measured by the measuring section 15 is a predetermined threshold value of less or the error frequency is zero, the refresh cycle adjusting section 26 lengthens the refresh cycle by the unit frequency each time the adjustment is carried out.

Then, when the refresh frequency is adjusted to one the same as the refresh frequency of the normal refresh mode after the start of adjustment of the refresh frequency, the refresh cycle adjusting section 26 judges that a state in which errors frequently occur is resolved and cancels the refresh cycle shortening mode to return to the normal refresh mode.

For example, as denoted in FIGS. 5(a) and 5(b), in a case where the refresh is being performed at the refresh cycle "CN1" (not illustrated) calculated on the basis of the number "N1" (see FIG. 5(b)) of times of refresh per unit time of the normal refresh mode, when an error is detected by the ECC circuit 14 (see the time "T1" in FIG. 5(a)), the normal refresh mode is shifted to the refresh cycle shortening mode (see after the time "T1" (on the right of the drawings) in FIGS. 5(a) and (b)).

Hereinafter, the symbols "CN1" and "CN2" obtained by attaching the symbol "C" in front of "N1" and "N2" representing the number of times of refresh per unit time represent refresh cycles calculated by the number "N1" and "N2" of times of refresh per unit time, respectively.

In the refresh cycle shortening mode, the refresh cycle adjusting section 26 starts the adjustment and stepwisely shortens the refresh adjustment (see the times "T1" through "T4" in FIG. 5(b)) each time the adjustment is carried out (see the time "t" in FIG. 5(b)), so that the refresh frequency is adjusted to a suitable cycle for the error occurring frequency. In other words, the refresh cycle adjusting section 26 stepwisely increases the number (see the symbol "n" in FIG. 5(b)) of times of refresh per unit time as denoted in FIG. 5(b) and accordingly, stepwisely shortens the refresh cycle.

Then, when the error frequency gradually decreases (see the times "T2" through "T3" in FIG. 5(a)) and the error frequency comes to be in a state of maintaining a constant value "E1" higher than the threshold value "TH" (see after the time "T3" in FIG. 5(a)), the refresh cycle adjusting section 26 stops shortening of the refresh cycle and maintains the constant refresh cycle "CN2" (see the symbol "N2" in FIG. 5(b)) (see after the time "T4" in FIG. 5(b)).

For example, while refresh is carried out at the refresh cycle "CN1" (the symbol "N1" in FIG. 6(b)) of the normal refresh mode, as denoted in FIGS. 6(a) and 6(b), if an error is detected by the ECC circuit 14 (see the time "T5" in FIG. 6(a)), the normal refresh mode is shifted to the refresh cycle shortening mode (see after the time "T5" in FIGS. 6(a) and 6(b)).

In the refresh cycle shortening mode, the refresh cycle adjusting section 26 starts the adjustment, and stepwisely shortens the refresh cycle through increasing the number of times of refresh per unit time by the predetermined unit number of times (e.g., see the symbol "n" in FIG. 6(b)) each time the adjustment is carried out (see the time "t" in FIG. 6(b)), so that the refresh frequency is adjusted to a suitable refresh cycle "CN2" (see the symbol "N2" in FIG. 6(b)) for the error occurring frequency (see the times T5" through "T6" in FIG. 6(b)).

Then, when the error frequency gradually decreases and maintains a state of being lower than the threshold value "TH" ("0" in the example of FIG. 6(a); see after the time "T6"), the refresh cycle adjusting section 26 stepwisely lengthens the refresh cycle through decreasing the number of times of refresh per unit time by a predetermined unit number (see the symbol "n" in FIG. 6(b)) of times each time the adjustment is carried out (see the symbol "t" in FIG. 6(b)), and thereby returns the refresh cycle to the refresh cycle "CN1" (see the symbol "N1" in FIG. 6(b)) of the normal refresh mode (see the times "T7" through "T8" in FIG. 6(b)).

Then, if the error frequency does not become higher than the threshold value "TH" (see after the time "T8" in FIG. 6(a)), the refresh cycle adjusting section 26 keeps the refresh cycle "CN1" (see the symbol "N1" in FIG. 6(b)) of the normal refresh mode (see after the time "T8" in FIG. 6(b)).

The monitoring interval varying section 27 varies, on the basis of the error frequency measured by the measuring section 15, the additional monitoring interval to be carried out by the patrol controller 17, and, for example, lengthens the additional monitoring interval when the error frequency measured by the measuring section 15 comes to be constant. In other words, the monitoring interval varying section 27 instructs the patrol controller 17 (normal patrol controlling section 24 and the additional patrol controlling section 25) on the timings at which patrol in the memory 11 is to be carried out.

In the first embodiment, the monitoring interval varying section 27 controls the variation in the above monitoring intervals with the use of a convergence counter (not illustrated) that counts the number of times that the error frequency stays unchanged until the current measurement by the measuring section 15 is carried out since the previous measurement by the measuring section 15 was carried out.

Such a convergence counter is realized by any known method and detailed description thereof is omitted. Specific procedure performed through the use of a convergence counter will be detailed below.

FIGS. 7(a) and 7(b) are timing charts of an example of varying the additional monitoring interval by the monitoring interval varying section of the memory refreshing circuit according to the first embodiment: FIG. 7(a) denotes a variation in the number of times of patrol in chronological order, and the ordinate and the abscissa thereof represent the number of times of patrol per unit time and time, respectively; and FIG. 7(b) denotes a variation in refresh cycle in chronological order, and the ordinate and the abscissa thereof represent the number of times of refresh per unit time and time, respectively.

Increase in the number of times of patrol per unit time means shortening of the monitoring interval.

For example, when the error frequency measured by the measuring section 15 becomes higher than the threshold value (not illustrated) while the memory controller 12 controls the normal patrol operation at the normal monitoring interval "IP1" calculated from the number "P1" of times of monitoring per unit time and controls the refresh operation at the refresh cycle "CN1" (see the symbol "N1" in FIG. 7(b)), the normal refresh mode is shifted to the refresh cycle shortening mode.

Hereinafter, the symbols "IP1", "IP2", and "IP3" obtained by attaching the symbol "I" in front of the symbols "P1", "P2", and "P3" representing the number of times of monitoring per unit time represent monitoring intervals calculated from the numbers "P1", "P2", and "P3" of times of monitoring per unit time, respectively.

In the refresh cycle shortening mode, the memory controller 12 controls the additional patrol operation at default value (short interval) "IP2" (see the symbol "P2" in FIG. 7(a)) of the additional monitoring interval. In harmony with the above control, the refresh cycle adjusting section 26 starts the adjustment, and stepwisely shortens the refresh cycle through increasing the number of times of refresh per unit time by a predetermined unit number (e.g., see the symbol "n" in FIG. 7(b)) of times each time the adjustment is carried out (see the time "t" in FIG. 7(b)), so that the refresh cycle is adjusted to a suitable refresh cycle "CN2" (see the symbol "N2" in FIG. 7(b)) for the error occurring frequency (see the times "T9" through "T10" in FIG. 7(b)).

Then, when the refresh cycle adjusting section 26 becomes a state of maintaining the refresh cycle "CN2" (see after the time "T10" in FIG. 7(b)), that is, when the error frequency measured by the measuring section 15 converges to become constant (not denoted), the monitoring interval varying section 27 carries out control in which the additional monitoring interval is lengthened from the short interval "IP2" (see the symbol "P2" in FIG. 7(a)) to the interval (long interval) "IP3" (see the symbol "P3" in FIG. 7(a)) longer than the short interval "IP2" (see the time "T11" in FIG. 7(a)).

This makes it possible to reduce unnecessary patrol, further aiming at enhancing the efficiency in the mechanism of error detection by adjustment of the additional monitoring interval concurrently with the adjustment of the refresh cycle.

In FIG. 1, the temperature sensor 19 senses the temperature of the memory 11, and the access counter 20 measures the access frequency to the memory 11, and counts, for example, the number of accesses to the memory 11 in a predetermined time period as the access frequency.

The temperature sensor 19 and the access counter 20 are techniques already known and the detailed description thereof is omitted.

The lower limit calculating section 21 calculates the lower limit (limit value) of the refresh cycle on the basis of the temperature sensed by the temperature sensor 19 and the access frequency measured by the access counter 20 as depicted in FIG. 1. For example, the lower limit calculating section 21 monitors the temperature sensor 19 and the access counter 20 at predetermined time intervals. When exceeding the access frequency threshold value predetermined as the upper limit value of the normal access frequency or exceeding the temperature threshold value predetermined as the upper limit value of the normal temperature, the lower limit calculating section 21 stepwisely lengthens the lower limit of the refresh cycle depending on the access frequency and the temperature. The lower limit calculating section 21 is configured to stepwisely lengthen the lower limit to one that does not exert an adverse effect on the memory 11.

In addition, the lower limit calculating section 21 notifies the refresh cycle adjusting section 26 of the calculated lower limit, and the refresh cycle adjusting section 26 sets the lower limit of the refresh cycle notified from the lower limit calculating section 21. Namely, the refresh cycle adjusting section 26 adjusts the refresh cycle to be the predetermined lower limit or more and varies the lower limit on the basis of the memory temperature representing the temperature of the memory 11 and of the access frequency of the memory 11.

FIGS. 8(a) and 8(b) are timing charts denoting an example of varying the lower limit of the refresh cycle by the refresh cycle adjusting section in the memory refreshing circuit according to the first embodiment.

FIG. 8(a) is a diagram denoting a variation in error frequency in chronological order, and the ordinate and the abscissa thereof represent the error frequency and time, respectively. FIG. 8(b) is a diagram denoting a variation in refresh cycle in chronological order, and the ordinate and the abscissa thereof represent the number of times of refresh per unit time and time, respectively.

Figure 8:
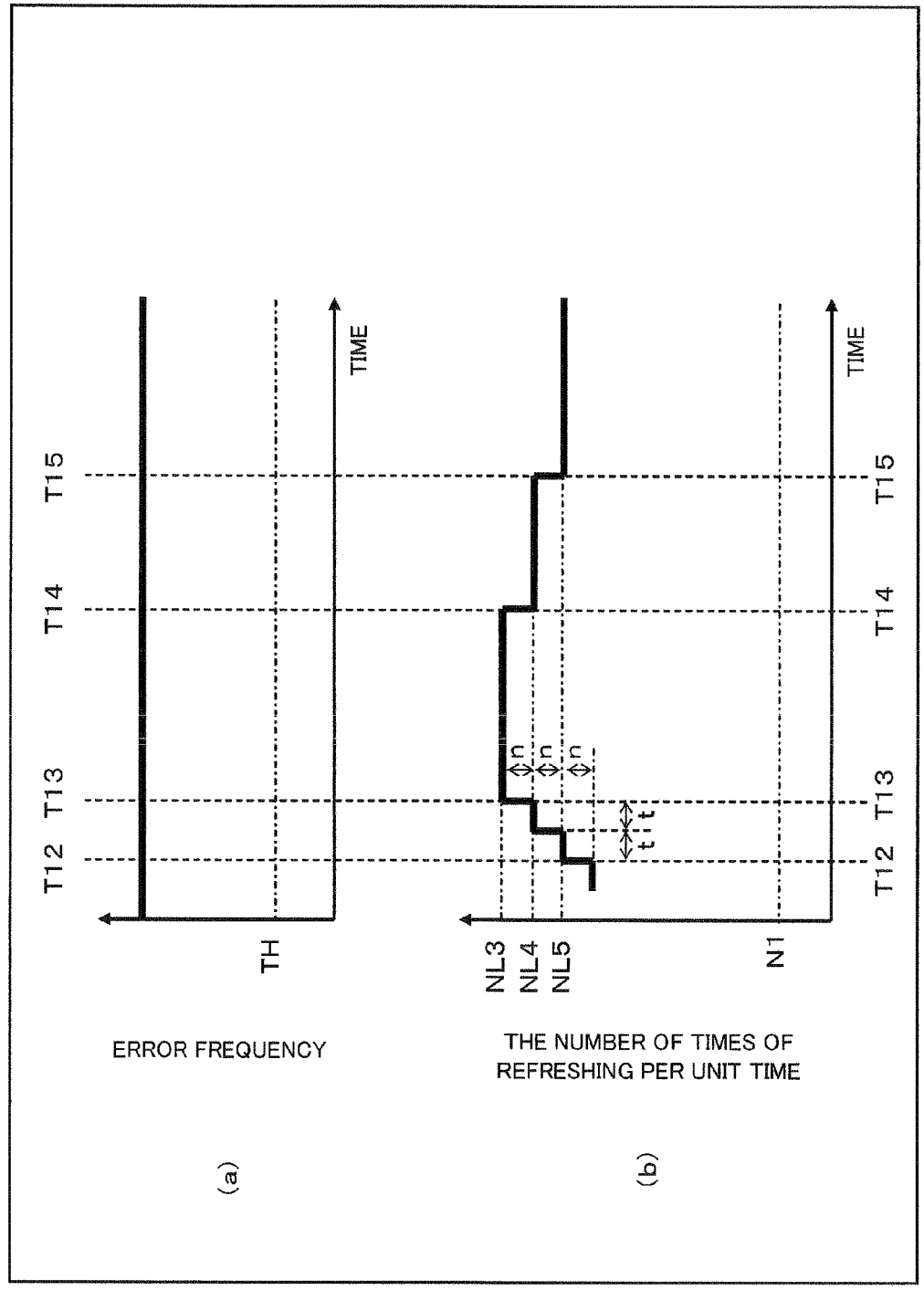
FIGS. 8(a) and (b) are timing charts denoting an example of varying the lower limit of the refresh cycle by the refresh cycle adjusting section in the memory refresh circuit of the first embodiment.

For example, as denoted in FIGS. 8(a) and 8(b), when the error frequency measured by the measuring section 15 maintains a state of being higher than the threshold value "TH", the refresh cycle shortening mode is being carried out, and the refresh cycle adjusting section 26 stepwisely shortens the refresh cycle (see the times T12″ through "T13" in FIG. 8(*b*)) through increasing the number of times of refresh per unit time by a predetermined unit number of times (e.g., see the symbol "n" in FIG. 8(*b*)) each time the adjustment is carried out (see the time "t" in FIG. 8(*b*)).

Then, the refresh cycle adjusting section 26 shortens the refresh cycle to the default value "CNL3" of the lower limit calculated from the predetermined number "NL3" (see FIG. 8(*b*)) of times of refresh per unit time, and maintains the refresh value of the default value "CNL3" of the lower limit (see the times "T13" through "T14" in FIG. 8(*b*)).

Hereinafter, the symbols "CNL3" through "CNL5" obtained by attaching the symbol "C" in front of the symbols "NL3" through "NL5" representing the number of times of refresh per unit time represent the lower limits calculated from the numbers "NL3" through "NL5" of times of refresh per unit time.

Here, the lower limit calculating section 21 monitors the access frequency and/or the temperature at predetermined time intervals (see the times "T14" through "T15" in FIG. 8(*b*)), and when sensing a state in which the memory 11 has a high temperature or is being frequently accessed, calculates the lower limit "CNL4" longer than the default value "CNL3" of the lower limit on the basis of the access frequency and/or the temperature. Further, the refresh cycle adjusting section 26 varies the lower limit from "CNL3" (see the symbol "NL3" in FIG. 8(*b*)) to "CNL4" (see the symbol "NL4" in FIG. 8(*b*)), and concurrently adjusts the refresh cycle from "CNL3" to "CNL4" (see the time "T14" in FIG. 8(*b*)).

After varying the lower limit of the refresh cycle to "CNL4", if a state in which the memory has a high temperature or is being frequently accessed is not resolved, the lower limit calculating section 21 calculates the lower limit "CNL5" (see the symbols "NL5" in FIG. 8(*b*)), which is longer than the lower limit "CNL4", on the basis of the access frequency and/or the temperature. In addition, the refresh cycle adjusting section 26 varies the lower limit from "CNL4" to "CNL5", and concurrently adjusts the refresh cycle from "CNL4" to "CNL5" (see the time "T15" in FIG. 8(*b*)).

When a state in which the memory 11 has a high temperature or is being frequently accessed is resolved, the refresh cycle adjusting section 26 returns the lower limit to the default value "CNL3".

Thereby, excessive refresh can be avoided and an adverse effect on the memory 11 caused by such excessive refresh can be also inhibited.

The timer 22 as depicted in FIG. 1 measures (counts) the time elapsed since an error in the memory 11 has been detected in the normal patrol operation by the normal patrol controlling section 24, and can be realized by various known methods. The timer 22 starts time measuring when the refresh cycle adjusting section 26 starts the adjustment of the refresh cycle, and notifies, when a predetermined time (timer threshold value) has passed, the shortening termination requesting section 23 to be detailed below of the time passage. If the adjustment of the refresh cycle terminates before the time elapsed reaches the timer threshold value, the timer 22 terminates the measurement.

Upon receipt of the notification of the time passage of the above timer threshold value from the timer 22, the shortening termination requesting section 23 notifies the refresh cycle adjusting section 26 of an instruction to terminate the adjustment of the refresh cycle, as a shortening termination request.

Upon receipt of the shortening termination request from the shortening termination requesting section 23, the refresh cycle adjusting section 26 terminates the adjustment of the refresh cycle, compulsorily returns the refresh cycle to the refresh cycles (predetermined value) of the normal refresh mode, and notifies the system (information processing apparatus; not illustrated) of the termination of the adjustment as a memory error.

Figure 9:
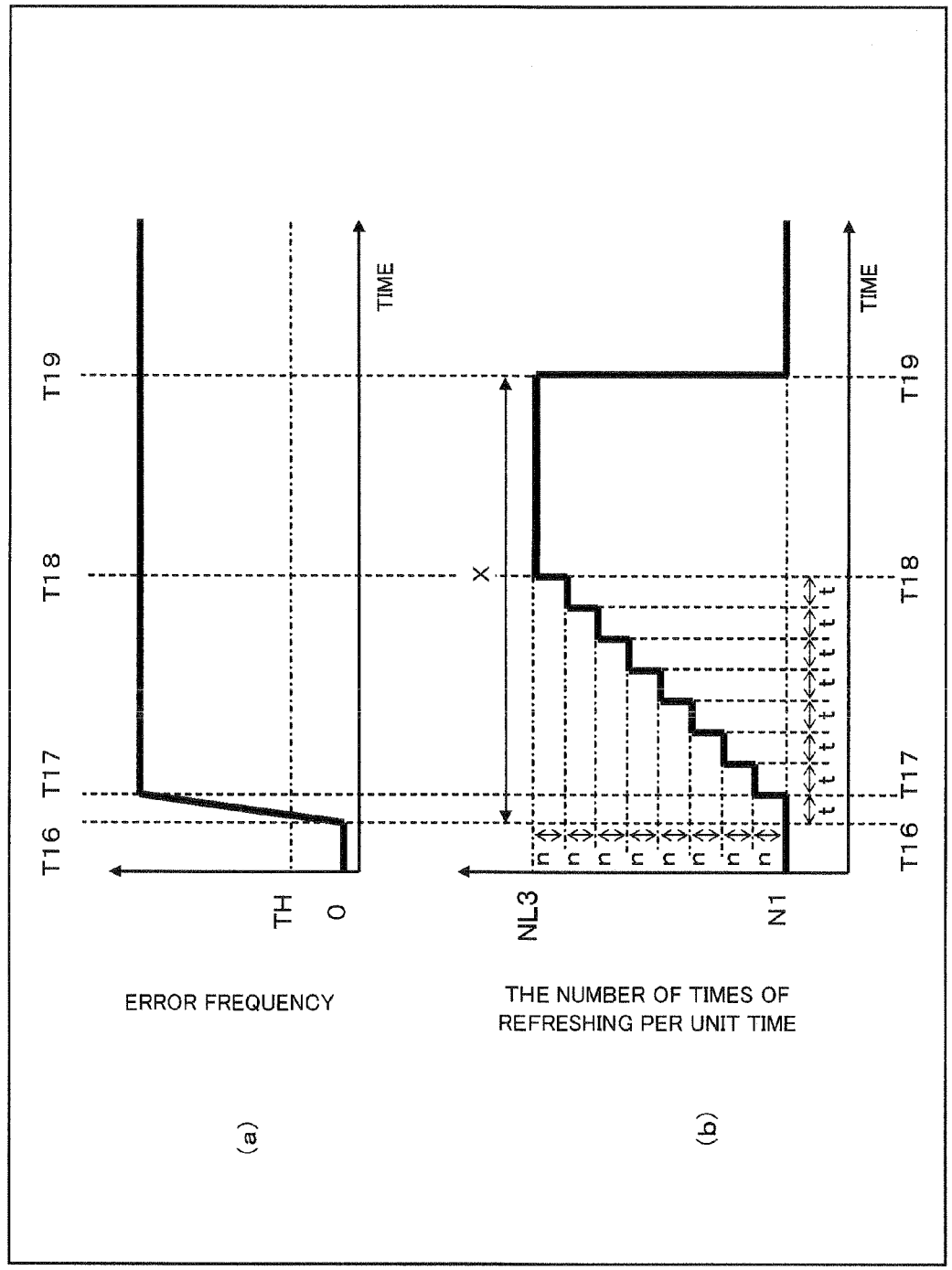
FIGS. 9(a) and (b) are timing charts denoting an example of canceling the adjustment of the refresh cycle by the refresh cycle adjusting section in the memory refresh circuit of the first embodiment.

FIGS. 9(*a*) and 9(*b*) are timing charts denoting an example of canceling the adjustment of the refresh cycle by the refresh cycle adjusting section of the memory refreshing circuit of the first embodiment.

FIG. 9(*a*) denotes a variation in error frequency in chronological order, and the ordinate and the abscissa thereof represent the error frequency and time, respectively; and FIG. 9(*b*) denotes a variation in refresh cycle in chronological order, and the ordinate and the abscissa thereof represent the number of times of refresh per unit time and time, respectively.

For example, as denoted in FIGS. 9(*a*) and 9(*b*), in the case where the memory controller 12 controls the refresh operation at the refresh cycle "CN1" (see the symbol "N1" in FIG. 9(*b*)) of the normal refresh mode, if an error is detected by the ECC circuit 14 (see the time T16″ in FIG. 9(*a*)) the normal refresh mode is shifted to the refresh cycle shortening mode (see after the time "T16" in FIGS. 9(*a*) and (*b*)).

In the refresh cycle shortening mode, the refresh cycle adjusting section 26 starts the adjustment, and stepwisely shortens the refresh cycle (see the times "T16" through "T18" in FIG. 9(*b*)) through increasing the number of times of refresh per unit time by a predetermined unit number (e.g., see the symbol "n" in FIG. 9(*b*)) each time the adjustment is carried out (see the symbol "t" in FIG. 9(*b*)).

Then, when the error frequency is in a state of being higher than the threshold value "TH" (see the time "T18" in FIG. 9(*a*)) even when the refresh cycle is shortened to the predetermined default value "CNL3" of the lower limit (see the symbol "NL3" in FIG. 9(*b*)), the refresh cycle adjusting section 26 maintains the refresh cycle of the default value "CNL3" of the lower limit (see the times "T18" through "T19" in FIG. 9(*b*)).

Under this state, when the timer threshold value "X" has been passed, keeping a state of the error frequency higher than the threshold value "TH", the shortening termination requesting section 23 receives a notification from the timer 22 and notifies the refresh cycle adjusting section 26 of the shortening termination request. Upon receipt of the notification from the shortening termination requesting section 23, the refresh cycle adjusting section 26 terminates the adjustment of the refresh cycle and resets the refresh cycle to the refresh cycle "CN1" of the normal refresh mode (see the time "T19" in FIG. 9(*b*)).

Accordingly, when a predetermined time has passed since an error in the memory 11 has been detected in the normal patrol operation by the normal patrol controlling section 24, the refresh cycle adjusting section 26 resets the refresh cycle to the predetermined value.

Thereby, it is possible to compulsorily cancel the adjustment of the refresh cycle according to an instruction from the timer 22 when an error is not resolved after a long time has passed since the refresh frequency has been shortened, that is, when the adjustment of the refresh cycle for a fixed time period does not attain an effect.

Figure 10:
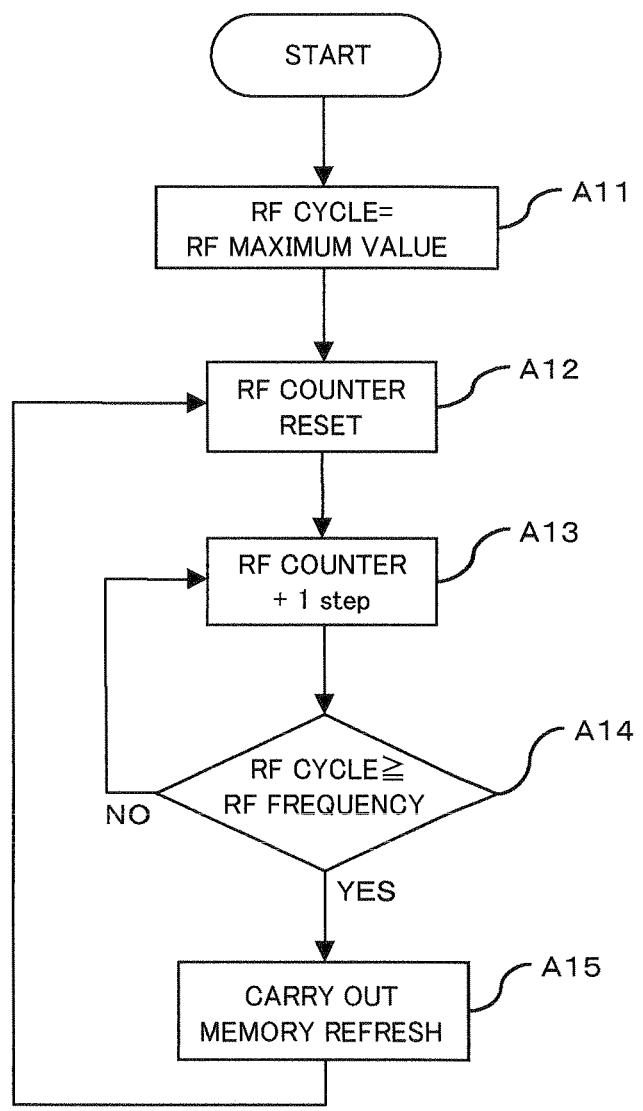
FIG. 10 A flow chart denoting an example of a specific procedure performed for refresh in the memory or the memory refresh circuit of the first embodiment.

Description will now be made in relation to an example of a specific processing procedure of refreshing the memory 11 of the memory refreshing circuit 10 according to the first embodiment having the above configuration along a flow chart FIG. 10 (A11 through A15).

In the description below, the term "RF counter" is a variable representing a value of the RF counter 48; and the term "RFcycle" is a variable representing, as the refresh cycle, the upper limit of the RF counter 48. Namely, when the value of the "RF counter" reaches the value of the "RF cycle", refresh is carried out. In addition, the term "RF maximum value" is a constant representing the maximum tolerance value as the refresh cycle "CN1" of the normal refresh mode, and when the "RF frequency"="RF maximum value", the refresh is carried out at the refresh cycle of the normal refresh mode (i.e., at the refresh cycle when no error has occurred).

When the memory refreshing circuit 10 is powered on, the value of the "RF maximum value" is set in the "RF cycle" (step A11) and the value of the "RF counter" is reset (step A12).

The "RF counter" is successively increased in increments of the value "1" (1 step) at predetermined intervals (step A13), and the value of the "RF counter" is compared with the value of the "RF cycle" (step A14). The increase processing is repeated until the value of the "RF counter" reaches the value of the "RFcycle" (see "NO" route of step A14).

Then, when the value of the "RF counter" reaches the value of the "RFcycle" (see "YES" route of step A14), the procedure returns to step A12 after the memory 11 is refreshed and process of the steps A12 through A15 is repeatedly carried out.

Thereby, refresh of the memory 11 is regularly carried out.

Figure 11:
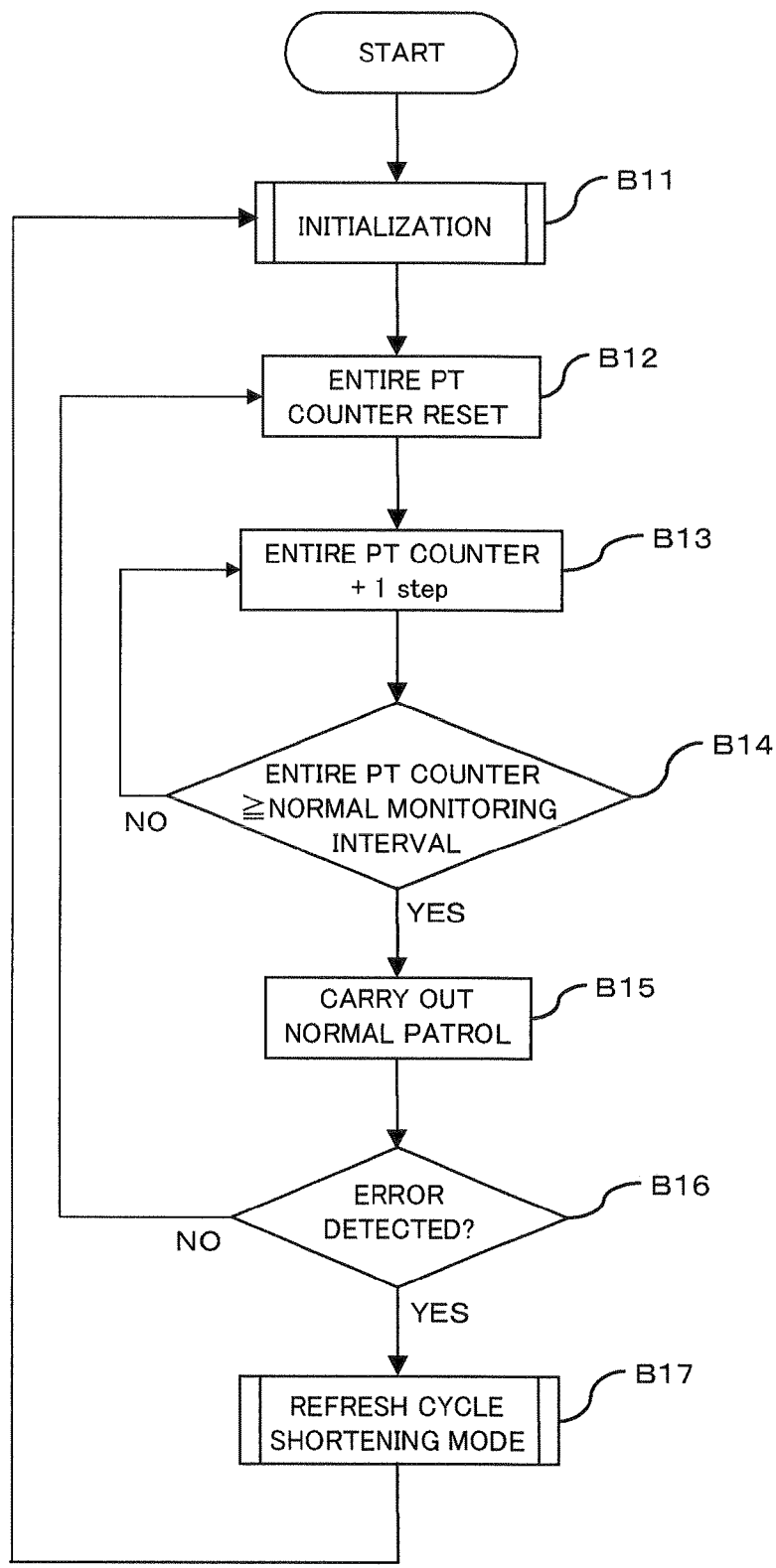
FIG. 11 A flow chart denoting an example of a specific procedure performed to control a normal patrol operation by a memory controller in the memory refresh circuit of the first embodiment.

Next, description will now be made in relation to control over the normal patrol operation by the memory controller 12 of the memory refreshing circuit 10 according to the first embodiment having the above configuration along the flow chart FIG. 11 (steps B11 through B17).

In the description below, the term "entire PT counter" is a variable representing a value of the entire PT counter and the term "normal monitoring interval" is a constant representing the upper limit of the entire PT counter as the normal monitoring interval "IP1".

The memory controller 12 carries out initialization that is to be detailed below (step B11) and resets the value of the entire PT counter" (step B12).

The memory controller 12 successively adds the value of 1 (1 step) to the "entire PT counter" (step B13) and successively compares the value of the "entire PT counter" and the "normal monitoring interval" (step B14). The memory controller 12 repeats the addition until the value of the "entire PT counter" reaches the value of the "normal monitoring interval" (see "NO" route of step B14).

When the value of the "entire PT counter" reaches the predetermined value of the "normal monitoring interval" (see "YES" route of step B14), the memory controller 12 controls the normal patrol operation (step B15, the normal patrol controlling step).

If an error is detected during the normal patrol operation (see "YES" route of step B16), the process in the refresh cycle shortening mode that is to be detailed below is started (step B17) and the procedure returns to step B11.

In the meantime, if no error is detected during the normal patrol operation (see "NO" route of step B16), the procedure returns to step B12.

Then, the memory controller 12 repeats the process of from steps B11 through step B17.

Thereby, the normal patrol operation is carried out on the entire memory 11 at predetermined monitoring intervals.

Figure 12:
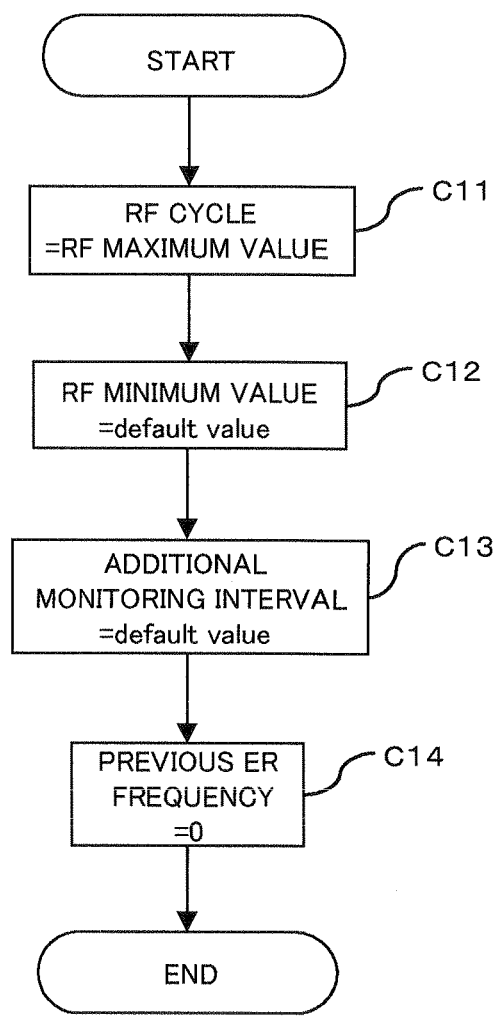
FIG. 12 A flow chart denoting an example of a specific procedure performed for initialization in the memory refresh circuit of the first embodiment.

Next, description will now be made in relation to the procedure of initialization performed in the memory refreshing circuit 10 according to the first embodiment having the above configuration along the flow chart FIG. 12 (steps C11 through C14).

In the following description, the terms "RF cycle" and "RF maximum value" mean the same as the above, and the term "RF minimum value" is a variable representing the minimum tolerance value of the RF counter 48 as the refresh cycle of the refresh cycle shortening mode. When the "RFcycle"="RF minimum value", refresh is carried out at the refresh cycle of the refresh cycle shortening mode. Further, the term "previous ER frequency" is a variable representing the error frequency previously measured by the measuring section 15 (the error frequency calculated in the previous loop) and further the term of "additional monitoring interval" is a variable representing the upper limit of an additional PT counter as the additional monitoring interval.

First of all, the "RF maximum value" is set in the "RF cycle" (step C11), and the default value is set in the "RF minimum value" (step C12).

Further, the default value is set in "the additional monitoring interval" (step C13), and "0" is set in the "previous ER frequency" (step C14) to terminate the procedure.

Figure 13:
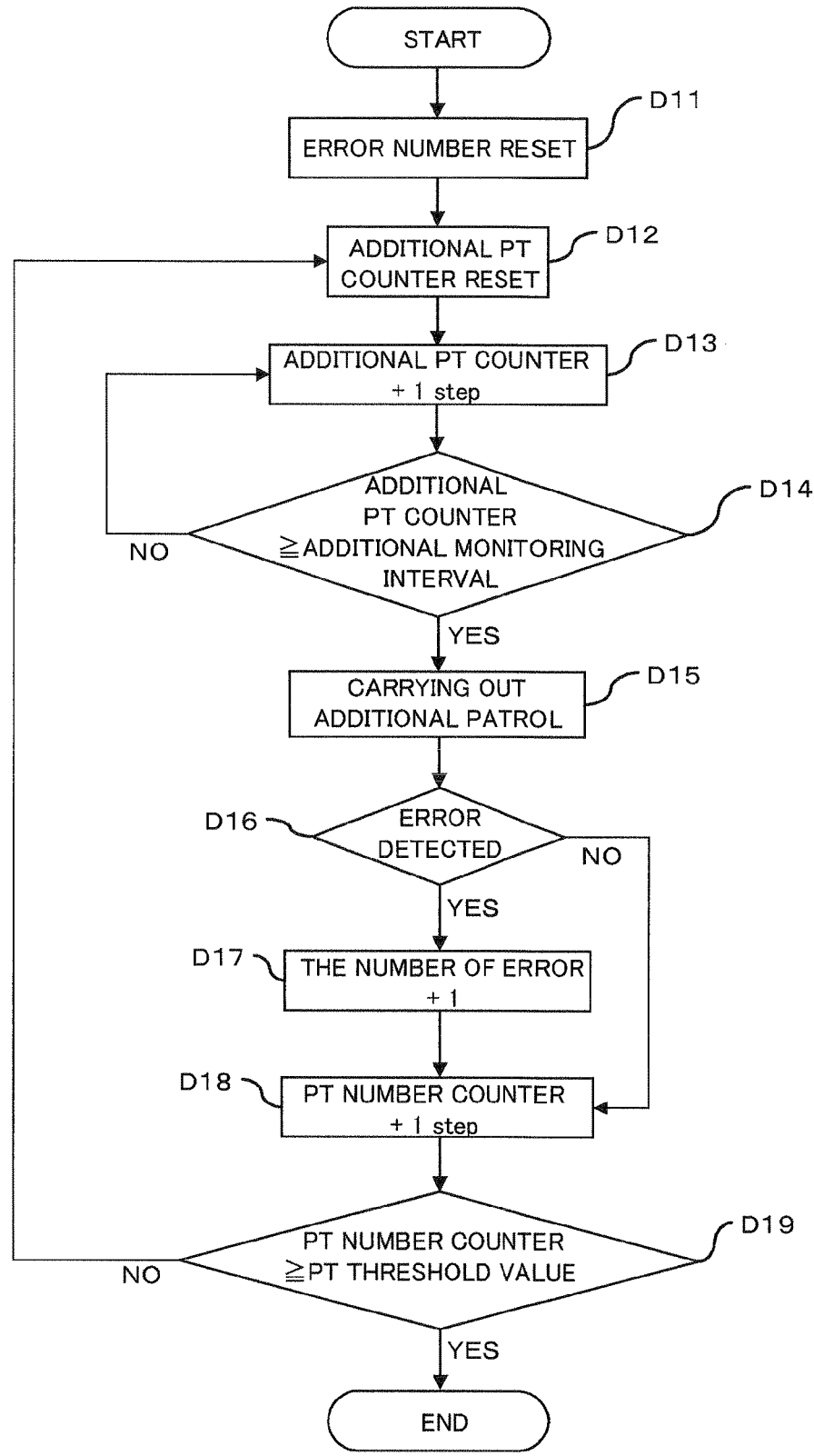
FIG. 13 A flow chart denoting an example of a specific procedure performed to control an additional patrol operation by the memory controller in the memory refresh circuit of the first embodiment.

Next, description will now be made in relation to control over the additional patrol operation by the memory controller 12 of the memory refreshing circuit 10 according to the first embodiment having the above configuration along the flow chart FIG. 13 (steps D11 through D19).

In the description below, the "additional monitoring interval" is described the same as the above, and an "additional PT counter" is a variable representing the value of the additional PT counter and a "PT number counter" is a variable representing the value of PT number counter. Further, the term "error number" is a variable representing the number of times of detection of an error of the error occurring address by the memory controller 12 (the number of times when an error is detected in patrol reading in the error address), and the term "PT threshold" is a constant representing the PT number counter as a time interval at which the adjustment of the refresh cycle is carried out.

The memory controller 12 resets the value of the "error number" (step D11) and resets the value of the "additional PT counter" (step D12).

The memory controller 12 successively increase the "additional PT counter" in increments of value "1 (1 step)" (step D13), and successively compares the value of the "additional PT counter" and the value of the "additional monitoring interval" (step D14). The addition is repeated until the value of the "additional PT counter" reaches the value of the "additional monitoring interval" (see "NO" route of step D14).

When the value of the "additional PT counter" becomes the value of the "additional monitoring interval" or more (see "YES" route of step D14), the memory controller 12 controls the additional patrol operation (step D15, the additional patrol controlling step).

Error detection is carried out in the additional patrol operation (step D16) and, if an error is detected in the additional patrol operation (see "YES" route of step D16), the memory controller 12 increases the "error number" by the value "1" (step D17), and increases the "PT number counter" by the value "1" (1 Step) (step D18).

In contrast, if no error is detected in the additional patrol operation (see "NO" route of step D16), the procedure shifts to step D18.

The memory controller 12 compares the value of the "PT number counter" and the "PT threshold value" (step D19), and when the value of the "PT number counter" is the "PT threshold value" or more (see "YES" route of step D19), terminates the procedure.

Conversely, when the value of the "PT number counter" is less than the "PT threshold value" (see "NO" route of step D19), the procedure returns to step D12.

Then, the process of from step D12 to step D19 is repeated until the value of the "PT number counter" becomes the "PT threshold value" or more.

Thereby, the additional patrol operation is carried out on the error occurring address at intervals sufficiently shorter than the normal monitoring interval.

Next, description will now be made in relation to a specific processing procedure to adjust the refresh cycle by the refresh cycle adjusting section 26 of the memory refreshing circuit 10 according to the first embodiment having the above configuration along FIGS. 5 and 6, following the flow chart FIG. 14 (steps E11 through E19).

In the description below, the terms "error number", "PT threshold value", "RF cycle", "RF maximum value", "previous ER frequency", and "RF minimum value" mean the same as the above. The term "ER frequency" is a variable representing an error frequency (error occurring rate) measured by the measuring section 15; and the term "ER threshold value" is a constant representing a threshold value "TH" (see FIGS. 5 and 6) for the judgment as to whether or not the refresh cycle should be shortened. When the "ER frequency">"ER threshold value", the refresh cycle is shortened.

In a state in which the additional patrol operation is being carried out (step E11), the measuring section 15 divides the value of "error number" by the "PT threshold value" to calculate the "ER frequency" (step E12; the measuring step).

The refresh cycle adjusting section 26 compares the value of "ER frequency" and the "ER threshold value" (see the symbol "TH" in FIGS. 5(a) and 6(a)) (step E13).

As the result of the comparison, when the value of "ER frequency" is the "ER threshold value" or more (see "NO" route of step E13; see the time "T2" in FIG. 5(a) and the times "T5" through "T6" in FIG. 6(a)), the refresh cycle adjusting section 26 judges whether or not the value of "ER frequency" is the same as the value of "previous ER frequency" (step E14).

When the value of "ER frequency" is different from the value of the "previous ER frequency" (see "NO" route of step E14, see the times "T1" through "T3" in FIG. 5(a)), the refresh cycle adjusting section 26 judges whether or not the value of the "RF cycle" is the same as the "RF minimum value" (step E15).

When the value of the "RF cycle" is different from the "RF minimum value" (see "NO" route of step E15; see the times "T2" to "T3" in FIG. 5(b), and the times "T5" through "T8" in FIG. 6(b)), the refresh cycle adjusting section 26 decreases "1" (1 step, see the time "t" in FIGS. 3(b) and 4(b)) from the "RF cycle" (decrement) (step E16, the refresh cycle adjusting step), sets the "previous ER frequency" as the "ER frequency" (step E17), and returns to step E11.

When the value of the "RF cycle" is the same as the "RF minimum value" (see "YES" route of step E15), the procedure shifts to step E17.

When the value of the "ER frequency" is the same as the value of the "previous ER frequency" (see "YES" route of step E14; see after the time "T4" in FIG. 5(a)), the procedure shifts to step E17.

In contrast, when the value of the "ER frequency" is less than the "ER threshold value" (see "YES" route of step E13; see after the time "T6" in FIG. 6(a)), the refresh cycle adjusting section 26 compares the value of the "RF cycle" and the "RF maximum value" (step E18).

When the value of the "RF cycle" is less than the "RF maximum value" (see "NO" route of step E18; see the times "T7" through "T8" in FIG. 6(b)), the refresh cycle adjusting section 26 adds the value "1" (1 step) to the "RF cycle" (step E19; the refresh cycle adjusting step) and shifts to step E17.

When the value of the "RF cycle" is the "RF maximum value" or more (see "YES" route of step E18; see after the time "T8" in FIG. 6(b)), the procedure is terminated.

Figure 14:
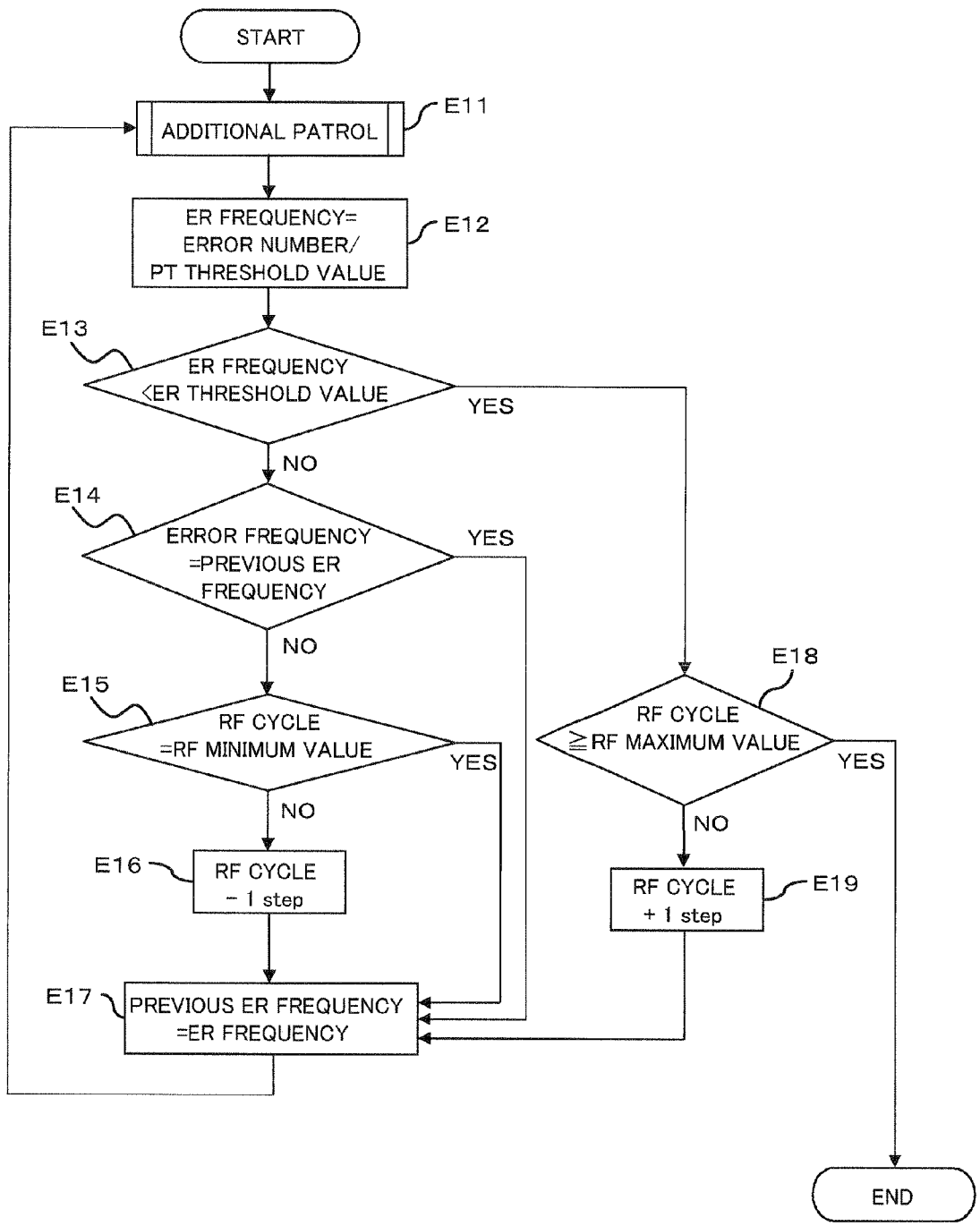
FIG. 14 A flow chart denoting an example of a specific procedure performed to adjust the refresh cycle by the refresh cycle adjusting section in the memory refresh circuit of the first embodiment.

In short, the refresh cycle adjusting section 26 carries out control denoted in Table 1 through carrying out the procedure of FIG. 14.

TABLE 1

| Variable | | |
| --- | --- | --- |
| ER frequency | RF cycle | Control |
| >Threshold value | =Previous Else | None |
| | Minimum | None |
| | Else | RF cycle − 1 |
| <Threshold value | <max | RF cycle + 1 |
| | Else | Termination |

Thereby, the refresh cycle is adjusted in accordance with the error frequency.

Figure 7:
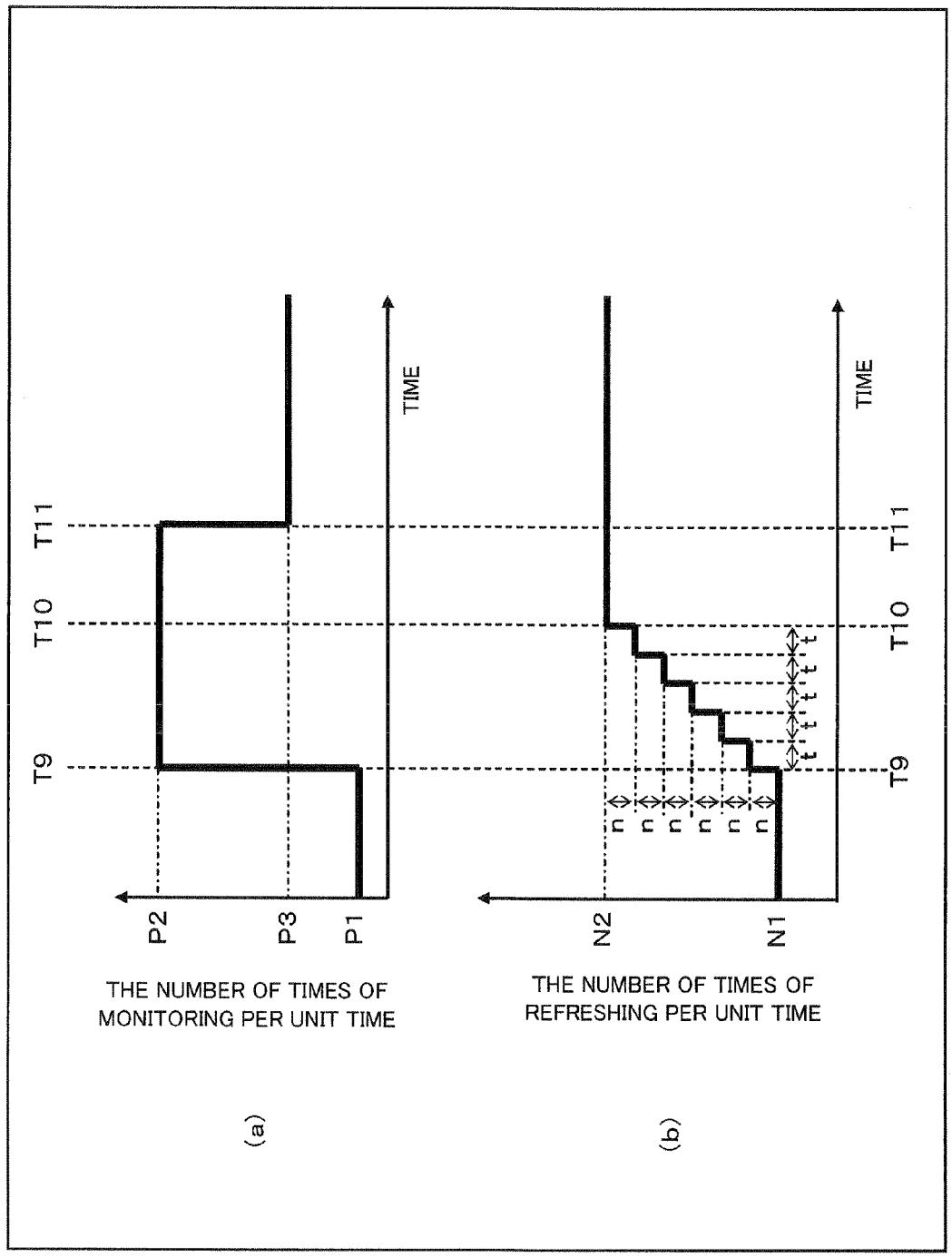
FIGS. 7(a) and (b) are timing chart denoting an example of varying an additional monitoring interval by a monitoring interval varying section in the memory refresh circuit of the first embodiment.
Figure 15:
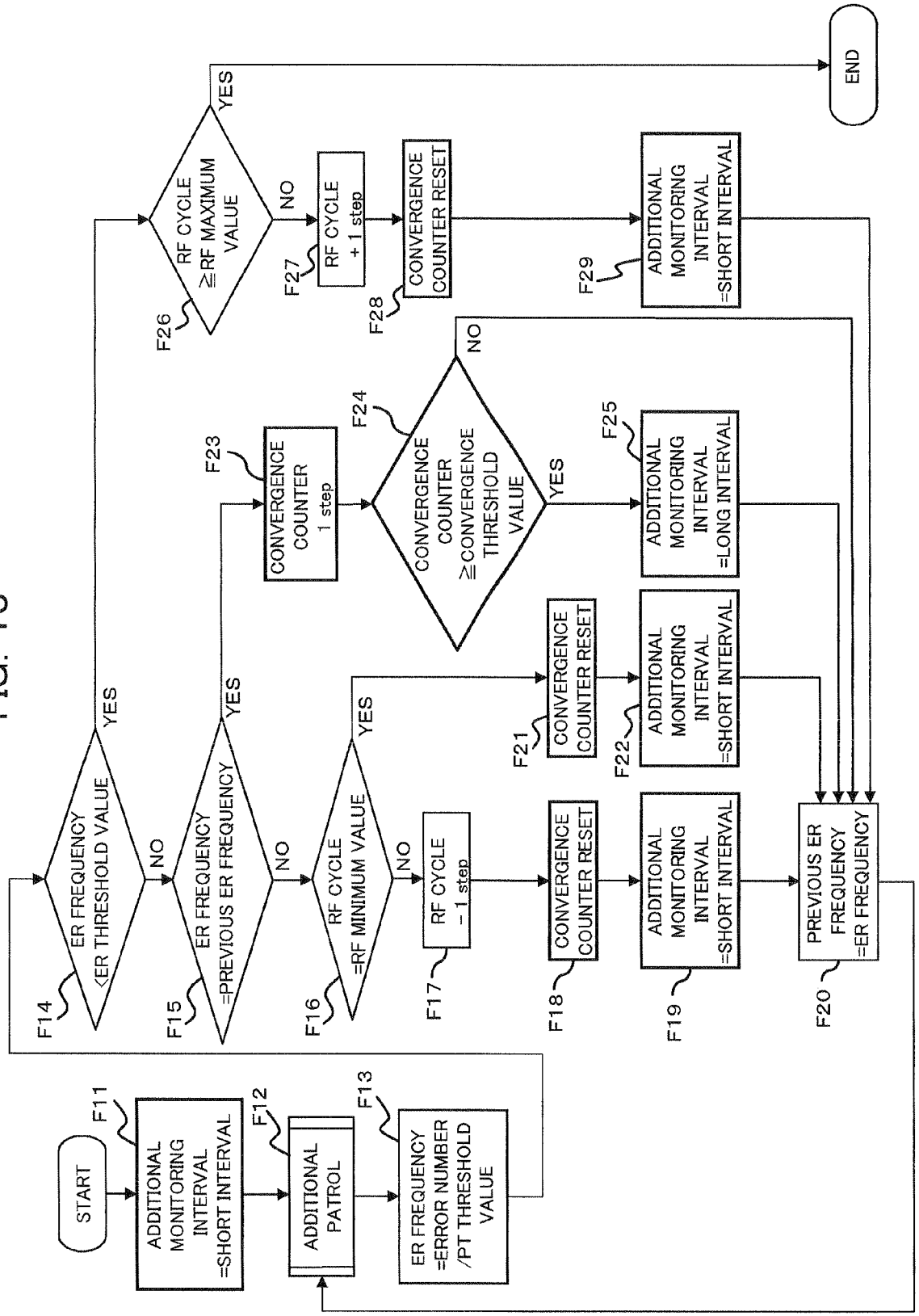
FIG. 15 A flow chart denoting an example of a specific procedure performed to vary an additional monitoring interval by the monitoring interval varying section in the memory refresh circuit of the first embodiment.

Next, description will now be made in relation to a specific processing procedure to vary the additional monitoring circuit by the monitoring interval varying section 27 of the memory refreshing circuit 21 according to the first embodiment having the above configuration with reference to FIG. 7 along the flow chart FIG. 15 (steps F11 through F29).

In the description below, the terms of the "error number", the "PT threshold value", the "RF cycle", the "RF maximum value", the "previous ER frequency", the "RF minimum value", the "normal monitoring interval", the "additional monitoring interval", and the "ER threshold value" mean the same as the above. The term "convergence threshold value" is a constant representing the upper limit of a convergence counter; the term "short interval" is a constant representing the default value "IP2" of the additional monitoring interval; and the term "long interval" is a constant representing an additional monitoring interval "IP3" longer than the short interval "IP2".

The monitoring interval varying section 27 sets the value of the "short interval" (see the time "P2" in FIG. 7(a)) in the additional monitoring interval (step F11).

Then, in a state in which the additional patrol operation is being carried out (step F12; see after the time "T9" in FIG. 7), the measuring section 15 divides the value of the "error number" by the "PT threshold value" to calculate the "error frequency" (step F13) and the refresh cycle adjusting section 26 compares the value of the "ER frequency" and the "ER threshold value" (step F14).

As the result of the comparison, when the value of the "ER frequency" is the "ER threshold value" or more (see "NO" route of step F14), the refresh cycle adjusting section 26 judges whether or not the value of the "ER frequency" is the same as the value of the "previous ER frequency" (step F15).

When the value of the "ER frequency" is different from the value of the "previous ER threshold frequency" (see "NO" route of step F15), the refresh cycle adjusting section 26 judges whether or not the value of the "RF cycle" is the same as the value of the "RF minimum value" (step F16).

When the value of the "RF cycle" is different from the "RF lower limit" (see "NO" route of step F16; see the times "T9" through "T10" in FIG. 7(b)), the refresh cycle adjusting section 26 decreases the value "1" (1 step) from the "RF cycle" (step F17).

Then, the monitoring interval varying section 27 resets the value of the "convergence counter" (step F18), and after setting the value of the "short interval" as "the additional monitoring interval" (step F19), the refresh cycle adjusting section 26 sets the value of "ER frequency" in the "previous ER frequency (step F20), and returns to step F12.

When the value of the "RF cycle" is the same as the value of the "RF minimum value" (see the symbol "NL3" in FIG. 7(b)) (see "YES" route of step F16; see the times "T10" through "T11" in FIG. 7(b)), the monitoring interval varying section 27 resets the value of the convergence counter" (step F21), sets the value of the "short interval" in the "additional monitoring interval" (step F22), and shifts to step F20.

When the value of "ER frequency" is the same as the value of the "previous ER frequency" (see "YES" route of step F15), the monitoring interval varying section 27 adds the value "1" (1 step) to the "convergence counter" (step F23), and compares the value of the "convergence counter" and the "convergence threshold value" (step F24).

When the value of "convergence counter" is the "convergence threshold value" or more (see "YES" route of step F24), the monitoring interval varying section 27 sets the value of the "long interval" (see the symbol "P3" in FIG. 7(a)) as the value of the "additional monitoring interval" (step F25; see after the time "T11" in FIG. 7(a); the monitoring interval varying step), and shifts to the step F20.

When the value of the convergence counter is less than the "convergence threshold value" (see "NO" route of step F24), the procedure shifts to step F20.

In the meantime, if the value of the "ER frequency" is less than the "ER threshold value" (see "YES" route of step F14), the refresh cycle adjusting section 26 compares the value of the "RF cycle" and the "RF maximum value" (step F26).

When the value of the "RF cycle" is less than the "RF maximum value" (see "NO" route of step F26), the refresh cycle adjusting section 26 adds the value "1" (1 step) to the "RF cycle" (step F27).

Then, the monitoring interval varying section 27 resets the value of the "convergence counter" (step F28), sets the value of the "short interval" as the "additional monitoring interval" (step F29), and shifts to step F20.

When the value of the "RF cycle" is the "RF maximum value" or more (see "YES" route of step F26), the procedure is terminated.

Thereby, the additional monitoring interval is lengthened when the shortened refresh cycle converges on a constant value.

Figure 16:
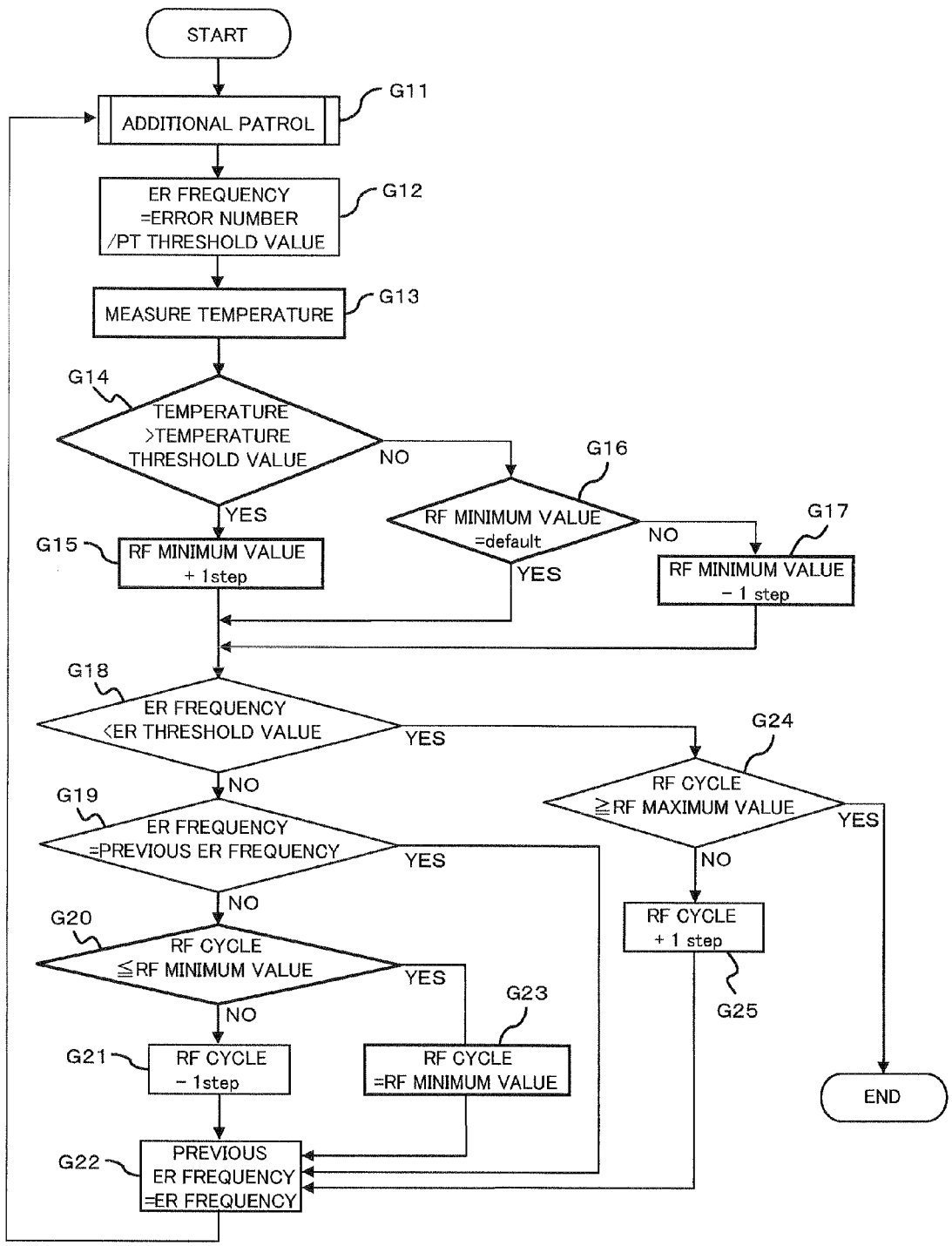
FIG. 16 A flow chart denoting an example of a specific procedure performed to calculate the lower limit by a lower limit calculating section in the memory refresh circuit of the first embodiment.

Next, description will now be made in relation to a specific processing procedure to calculate the lower limit by the lower limit calculating section 21 of the memory refreshing circuit 10 according to the first embodiment having the above configuration with reference to FIG. 8 along the flow chart FIG. 16 (steps G11 through G25).

In the description below, the terms "error number", "PT threshold value", "RF cycle", "RF maximum value", "previous ER frequency", "RF minimum value", and "ER threshold value" mean the same as the above. The term "temperature" is a variable representing the temperature measured by the temperature sensor 19; and the term "temperature threshold value" is a constant representing the upper limit of the temperature at which the system is judged to be normal.

In a state in which the additional patrol is being carried out (step G11), the measuring section 15 divides the value of the "error number" by the "PT threshold value" to calculate the "error frequency" (step G12).

The lower limit calculating section 21 measures the temperature on the basis of the temperature sensor 19 (step G13), and compares the value of the "temperature" and the "temperature threshold value" (step G14).

When the value of the "temperature" is larger than the "temperature threshold value" (see "YES" route of step G14), the lower limit calculating section 21 adds the value "1" (1 step; see the symbol "n" in FIG. 8(b)) to the "RF minimum value" (step G15), and shifts to step G18.

When the value of the "temperature" is the "temperature threshold value" or less (see "NO" route of step G14), the lower limit calculating section 21 judges whether or not the "RF minimum value" is the default value (step G16). When the "RF minimum value" is the default value (see "YES" route of step G16), the procedure shifts to step G18.

When "RF minimum value" is not the default value (see "NO" route of step G16), the lower limit calculating section 21 decreases (the value "1" (1 step) from the "RF minimum value" (step G17), and shifts to the step G18.

Then, the refresh cycle adjusting section 26 compares the value of "ER frequency" and the "ER threshold value" (see the symbol "TH" in FIG. 8(a)) (step G18).

As the result of the comparison, when the value of the "ER frequency" is the "ER threshold value" or more (see "NO" route of step G18), the refresh cycle adjusting section 26 judges whether or not the value of the "ER frequency" is the same as the value of the "previous ER frequency" (step G19).

When the value of the "ER frequency" is different from the value of the "previous ER frequency" (see "NO" route of step G19), the refresh cycle adjusting section 26 judges whether or not the value of the "RF cycle" is the same as the "RF minimum value" (step G20).

When the value of the "RF cycle" is different from the "RF minimum value" (see "NO" route of step G20), the value "1" (1 step) is decreased from the RF cycle" (step G21), the value of the "previous ER frequency" is set as the value of "ER frequency" (step G22), and the procedure returns to step G11.

When the value of the "ER frequency" is the same as the value of the "previous ER frequency" (see "YES" route of step G20), the refresh cycle adjusting section 26 sets the value of the "RF cycle" to be the "RF minimum value" (step G23), and shifts to step G22.

When the value of the "ER frequency" is the same as the value of the "previous ER frequency" (see "NO" route of step G19; see FIG. 8(a)), the procedure shifts to step G22.

In contrast, when the value of the "ER frequency" is less than the "ER threshold value" (see "YES" route of step G18), the refresh cycle adjusting section 26 compares the value of the "RF cycle" and the "RF maximum value" (step G24).

When the value of the "RF cycle" is less than the "RF maximum value" (see "NO" route of step G24), the refresh cycle adjusting section 26 adds the value "1" (1 step) to the "RF cycle" (step G25) and shifts to step G22.

When the value of the "RF cycle" is the "RF maximum value" or more (see "YES" route of step G24), the procedure is terminated.

Thereby, excessive refresh can be avoided and an adverse effect on the memory 11 caused by such excessive refresh can be inhibited.

Figure 17:
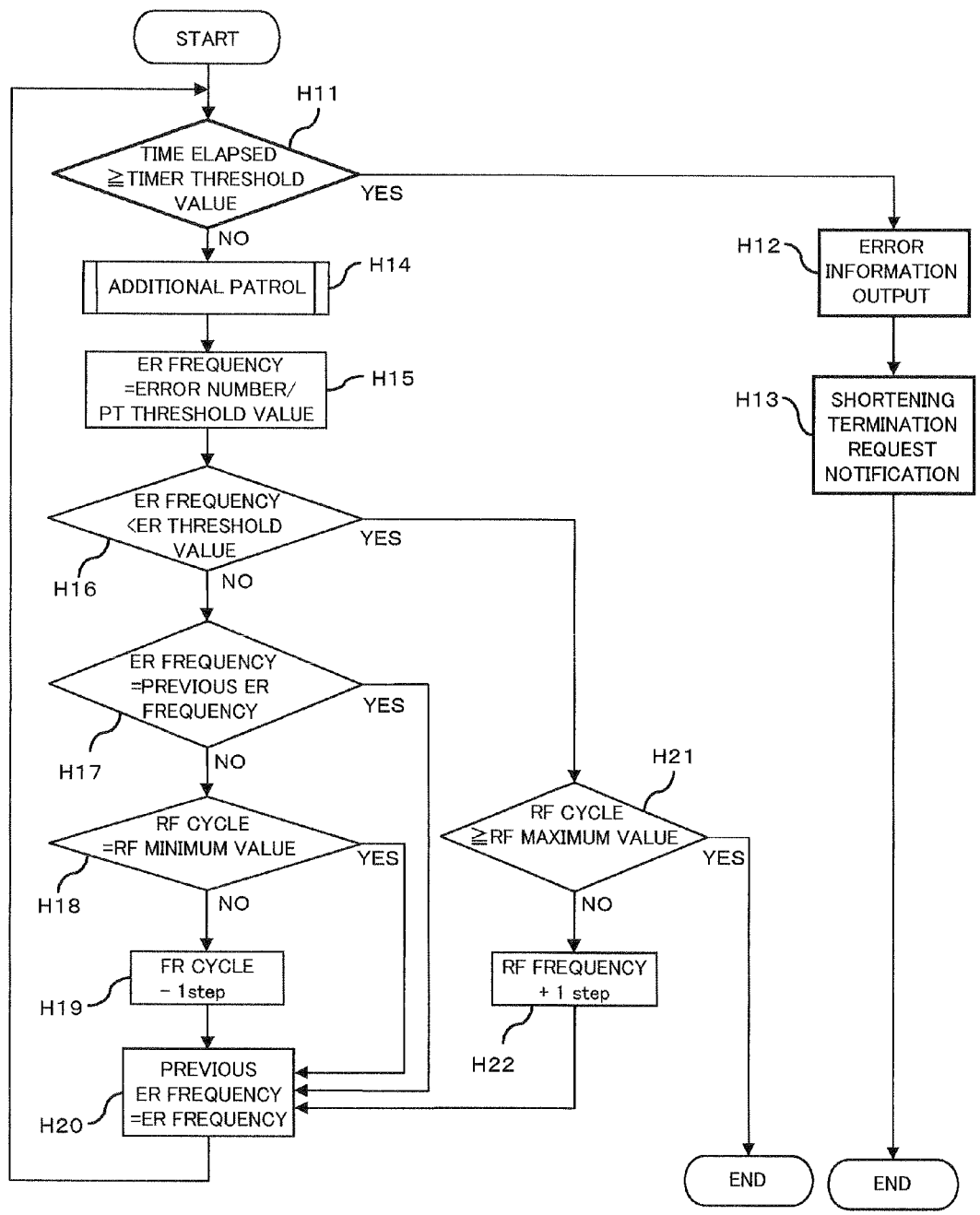
FIG. 17 A flow chart denoting an example of a specific procedure performed, when the timer threshold value has passed, by a shortening termination requesting section in the memory refresh circuit of the first embodiment.
Figure 18:
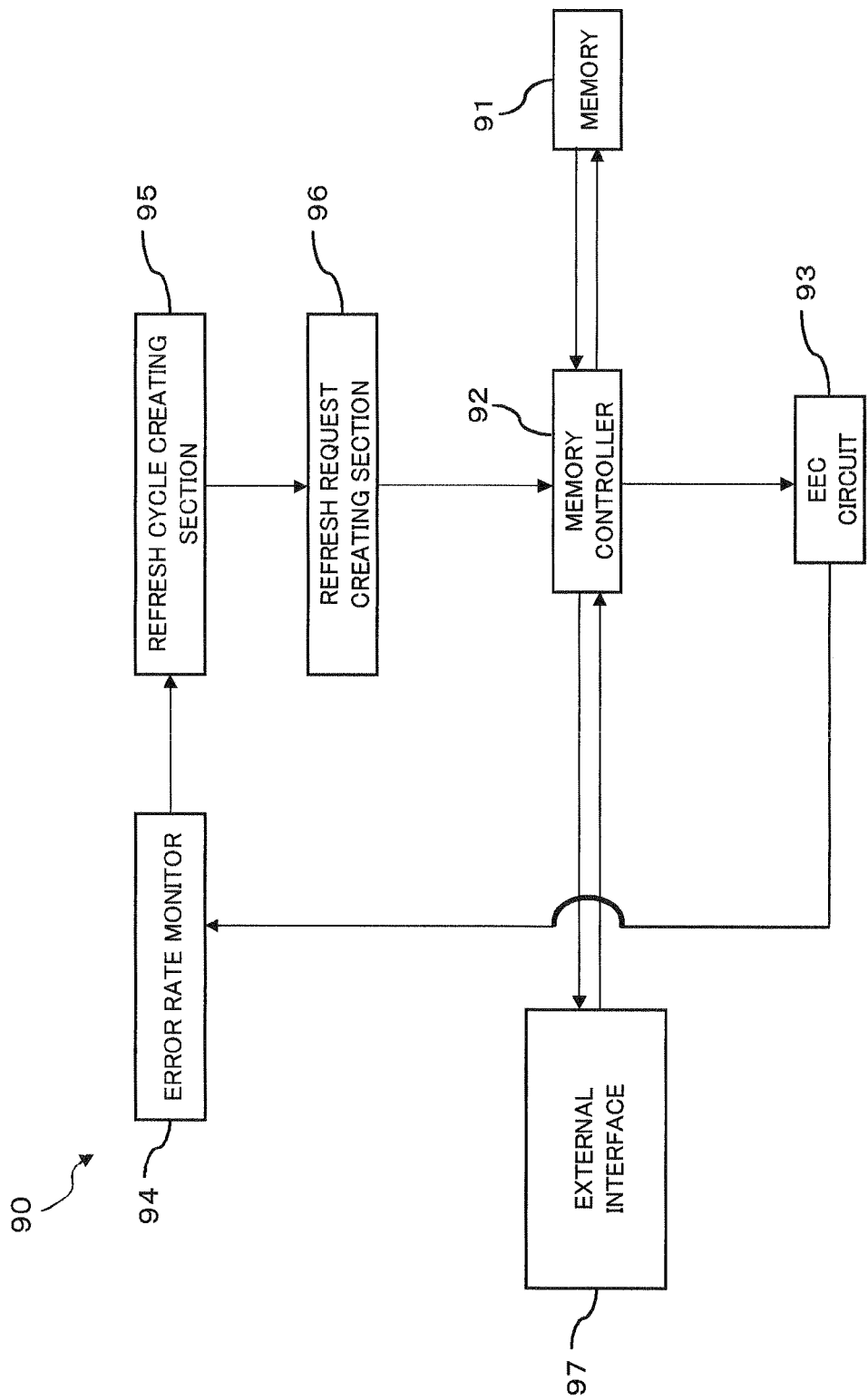
FIG. 18 A diagram schematically depicting a conventional operation manner to control a memory refresh cycle.

Next, description will now be made in relation to a specific processing procedure performed, when the timer threshold value has passed, by the shortening termination requesting section 23 of the memory refreshing circuit 10 according to the first embodiment having the above configuration with reference to FIG. 9 along the flow chart FIG. 17 (steps H11 through H22).

In the description below, the terms "error number", "PT threshold value", "RF cycle", "RF maximum value", "previous ER frequency", "RF minimum value", and "ER threshold value" mean the same as the above. The term "time elapsed" is a variable representing the time of the timer 22, and the term of the "timer threshold value" is a constant representing the upper limit "X" (see FIG. 9(b)) at which the control is terminated because of timeout.

The timer 22 compares the value of the "time elapsed" and the "timer threshold value" (see the symbol "X" in FIG. 9(b)) (step H11).

When the value of the "time elapsed" is the "timer threshold value" or more (see "YES" route of step H11; see after the time "T19" in FIG. 9), the shortening termination requesting section 23 notifies the system (information processing apparatus; not illustrated) of a memory error representing that the adjustment is terminated (step H12), notifies the refresh cycle adjusting section 26 of a shortening termination request (step H13), and terminates the procedure.

When the value of the "time elapsed" is less than the "timer threshold value" (see "NO" route of step H11; see times "T16" through "T19" in FIG. 9(b)), the measuring section 15 divides the value of the "error number" by the "PT threshold value" to calculate the "error frequency" (step H15) under a state in which the additional patrol operation is being carried out (step H14).

The refresh cycle adjusting section 26 compares the value of the "ER frequency" and the "ER threshold value" (see the symbol "TH" in FIG. 9(a)) (step H16).

As the result of the comparison, when the value of the "ER frequency" is the "ER threshold value" or more (see "NO" route of step H16; see after the time "T17" in FIG. 9(a)), the refresh cycle adjusting section 26 judges whether or not the value of the "ER frequency" is the same as the value of the "previous ER frequency" (step H17).

When the value of the "ER frequency" is different from the value of the "previous ER frequency" (see "NO" route of step H17; see the times "T16" through "T19" in FIG. 9(b)), the refresh cycle adjusting section 26 judges whether or not the value of the "RF cycle" is the same as the "RF minimum value" (see the symbol "NL3" in FIG. 9(b)) (step H18).

When the value of the "RF cycle" is different from the "RF minimum value" (see "NO" route of step H18; see the times "T16" through "T19" in FIG. 9(b)), the value "1" (1 step) is reduced from the "RF cycle" (step H19), the "previous ER frequency" is set as the "ER frequency" (step H20), and the procedure returns to step H11.

When the value of the "RF cycle" is the same as the "RF minimum value" (see "YES" route of step H18; see the time "T18" through "T19" in FIG. 9(b)), the procedure shifts to step H20.

When the value of the "ER frequency" is the same as the value of the "previous ER frequency" (see "YES" route of step H17), the procedure shifts to step H20.

In contrast, when the value of the "ER frequency" is less than the "ER threshold value" (see "YES" route of step H16), the refresh cycle adjusting section 26 compares the value of "RF cycle" and the "RF maximum value" (step H21).

When the value of the "RF cycle" is less than the "RF maximum value" (see "NO" route of step H21), the refresh cycle adjusting section 26 adds the value "1" (1 step) to the "RF cycle" (step H22) and shifts to step H20.

When the value of the "RF cycle" is the "RF maximum value" or more (see "YES" route of step H21), the procedure is terminated.

Thereby, it is possible to compulsorily cancel the adjustment of the refresh cycle when an error is not resolved after a long time has passed since the refresh frequency has been shortened.

As described above, the memory refreshing circuit 10 of the first embodiment controls the normal patrol operation that patrols the memory 11 and additionally controls, when an error is detected in the memory 11 during the normal patrol operation, the additional patrol operation that patrols the error occurring address, thereby enhancing the efficiency of the mechanism of error detection. Further, if an error in the error occurring address is detected during the additional patrol operation, the refresh cycle is adjusted depending on the error frequency of the same error occurring address, so that the refresh cycle suitable for the state of error occurrence can be optimized at shorter intervals than that of the case where the entire memory 11 is patrolled. Accordingly, it is possible to improve the responsiveness of a case where the operational environment of the system temporarily varies.

Further, the refresh cycle is stepwisely shortened when the error frequency measured by the measuring section 15 increases while the refresh cycle is stepwisely lengthened when the error frequency measured by the measuring section 15 decreases. This carries out the adjustment on the refresh cycle step by step at short intervals in harmony with the variation in error frequency, so that, if the variation in error frequency is small, the degree of the adjustment of the refresh cycle can be suppressed to be small. Accordingly, it is possible to efficiently optimize the refresh cycle suitable for the state of error occurrence in the memory 11.

In addition, varying the lower limit on the basis of the temperature of the memory 11 by the lower limit calculating section 21 makes it possible to avoid excessive refresh that cannot be avoided based only on the error frequency, and concurrently inhibit adverse effects on operation in the memory 11 caused by such excessive refresh.

Further, varying the lower limit on the basis of the access frequency of the memory 11 by the lower limit calculating section 21 makes it possible to avoid excessive refresh cannot be avoided based only on the error frequency, and concurrently inhibit adverse effects on operation in the memory 11 caused by inhibition of read/write access.

Still further, since the refresh cycle is compulsorily returned to that of the normal refresh mode when the time elapsed since an error has been detected in the memory 11 during the normal patrol operation exceeds the timer threshold value, the adjustment of the refresh cycle is not carried out on an uncorrectable error, so that unsuccessful refresh can be prevented from being continued.

Further, since the additional monitoring interval is lengthened when the error frequency measured by the measuring section 15 becomes constant, unnecessary patrol can be eliminated. In addition, the efficiency of the mechanism of error detection can be enhanced by adjustment of the additional monitoring interval concurrently with the preparation (adjustment) of the refresh cycle.

(2) Others:

The present embodiment should by no means be limited to the foregoing embodiment described above and can be variously modified without departing the gist of the present embodiment.

For example, the measuring section 15 measures, as the error frequency, the number of errors occurring in the error occurring area per predetermined time period in the first embodiment. However, the present embodiment is not limited to this. Alternatively, when a number of error occurring areas are detected during the additional patrol operation performed by the additional patrol controlling section 25, the measuring section 15 may measure, as the error frequency, the number of error occurring areas. Thereby, the measurement can be accomplished in a short time because there is no need to wait for passage of a predetermined time period as performed in counting the number of errors in the predetermined time period.

In the above first embodiment, the ECC circuit 14 uses a single-error-correction double-error(-detection) code, to which the present embodiment does not limit a code. Alternatively, error detection/correction code having detection and correction capability may be used.

Further, the configuration of the above first embodiment includes the lower limit calculating section 21, the shortening termination requesting section 23, and the monitoring interval varying section 27, but the configuration thereof is not limited to this. There is no need to always include all of these sections in the configuration.

With reference to the disclosure of the above embodiment, those ordinarily skilled in the art can carry out and produce the present embodiment.

INDUSTRIAL APPLICABILITY

The present embodiment can be various memory devices requiring refresh operation.

The present embodiment controls the normal patrol operation that patrols the memory and additionally controls, if an error is detected in the memory during the normal patrol operation, the additional patrol operation that patrols the error occurring address, thereby enhancing the efficiency of the mechanism of error detection. In addition, if an error is detected during the additional patrol operation, the refresh cycle is adjusted depending on the error frequency of the error occurring area, so that the refresh cycle suitable for the state of error occurrence can be optimized at shorter intervals than that of the case where the entire memory is patrolled. Accordingly, it is possible to improve the responsiveness of a case where the operational environment of the system temporarily varies.

Further, the refresh cycle is stepwisely shortened when the error frequency increases while the refresh cycle is stepwisely lengthened when the error frequency decreases. This carries out the adjustment on the refresh cycle step by step at short intervals in harmony with the variation in error frequency, so that, if the variation in error frequency is small, the degree of the adjustment of the refresh cycle can be suppressed to be small. Accordingly, it is possible to efficiently optimize the refresh cycle suitable for the state of error occurrence in the memory.

In addition, varying the lower limit on the basis of the temperature of the memory makes it possible to avoid excessive refresh that cannot be avoided by control based only on the error frequency, and concurrently inhibit adverse effects on operation in the memory caused by such excessive refresh.

Further, varying the lower limit on the basis of the access frequency of the memory makes it possible to avoid excessive refresh cannot be avoided by control based only on the error frequency, and concurrently inhibit adverse effects on operation in the memory caused by inhibition of read/write access.

Still further, since the refresh cycle is compulsorily returned to that of the normal refresh mode when the time elapsed since an error detected in the memory during the normal patrol operation exceeds the timer threshold value, the adjustment of the refresh cycle is not carried out on an uncorrectable error, so that unsuccessful refresh can be prevented from being continued.

Further, since the additional monitoring interval is lengthened when the error frequency becomes constant, unnecessary patrol can be eliminated. In addition, the efficiency of the mechanism of error detection can be enhanced by adjustment of the additional monitoring interval concurrently with the preparation (adjustment) of the refresh cycle.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment has been described in detail, it should be understood that the various changes, substitutions, and alterations could be made hereto without departing from the spirit and scope of the invention.

What is claimed is:

1. A memory refreshing circuit that refreshes a memory at a refresh cycle, comprising:
   a normal patrol controller that controls a normal patrol operation that patrols entire address of the memory;
   an additional patrol controller that controls an additional patrol operation that patrols, when a first error in the memory is detected during the normal patrol operation performed by the normal patrol controller, an error occurring address at which the first error has occurred;
   an error monitor that measures, when a second error is detected at the error occurring address during the additional patrol operation performed by the additional patrol controller, an error frequency representing information of error occurred at the error occurring address; and
   a refresh cycle adjustment controller that adjust the refresh cycle in accordance with the error frequency measured by the error monitor,
   wherein the refresh cycle adjustment controller stepwisely shortens the refresh cycle when the error frequency measured by the error monitor increases, and the refresh cycle adjustment controller stepwisely lengthens the refresh cycle when the error frequency measured by the error monitor decreases.

2. The memory refreshing circuit according to claim 1, wherein the error monitor measures, as the error frequency, the number of errors at the error occurring address per predetermined time period.

3. The memory refreshing circuit according to claim 1, wherein, when a plurality of the error occurring addresses are detected during the additional patrol operation performed by the additional patrol controller, the error monitor measures, as the error frequency, the number of the error occurring addresses.

4. The memory refreshing circuit according to claim 1, wherein the refresh cycle adjustment controller adjusts the refresh cycle to a predetermined lower limit or more.

5. The memory refreshing circuit according to claim 4, wherein the refresh cycle adjustment controller varies the lower limit on the basis of an access frequency to the memory.

6. The memory refreshing circuit according to claim 4, wherein the refresh cycle adjustment controller varies the lower limit on the basis of memory temperature representing the temperature of the memory.

7. The memory refreshing circuit according to claim 4, wherein the refresh cycle adjustment controller resets the refresh cycle to a default value when an elapsed time passed since the first error has been detected in the normal patrol operation performed by the normal patrol controller exceeds a predetermined time period.

8. The memory refreshing circuit according to claim 1, further comprising a monitoring interval controller varying a monitoring interval of the additional patrol operation on the basis of the refresh cycle adjusted by the refresh cycle adjustment controller.

9. The memory refreshing circuit according to claim 8, wherein the monitoring interval controller lengthens the monitoring interval when the error frequency measured by the error monitor becomes constant.

10. A method for refreshing a memory at a refresh cycle, comprising:
controlling a normal patrol operation that patrols entire address of the memory;
controlling an additional patrol operation that patrols, when a first error in the memory is detected during the normal patrol operation performed in the normal patrol controlling, an error occurring address at which the first error has occurred;
measuring, when a second error is detected at the error occurring address during the additional patrol operation performed in the additional patrol controlling, an error frequency representing information of error occurred at the error occurring address; and
adjusting the refresh cycle in accordance with the error frequency measured in the measuring,
wherein in the refresh cycle adjusting, the refresh cycle is stepwisely shortened when the error frequency measured in the measuring increases, and the refresh cycle is stepwisely lengthened when the error frequency measured in the measuring decreases.

11. The method for refreshing a memory according to claim 10, wherein in the measuring, the number of errors at the error occurring address per predetermined time period is measured as the error frequency.

12. The method for refreshing a memory according to claim 10, wherein, when a plurality of the error occurring addresses are detected during the additional patrol operation performed in the additional patrol controlling, the number of the error occurring addresses is measured as error frequency in the measuring.

13. The method for refreshing a memory according to claim 10, wherein in the refresh cycle adjusting, the refresh cycle is adjusted to a predetermined lower limit or more.

14. The method for refreshing a memory according to claim 13, wherein in the refresh cycle adjusting, the lower limit is varied on the basis of an access frequency to the memory.

15. The method for refreshing a memory according to claim 13, wherein in the refresh cycle adjusting, the lower limit is varied on the basis of memory temperature representing the temperature of the memory.

16. The method for refreshing a memory according to claim 13, wherein in the refresh cycle adjusting, the refresh cycle is reset to a default value when an elapsed time passed since the first error has been detected in the normal patrol operation performed in the normal patrol controlling exceeds a predetermined time period.

17. The method for refreshing a memory according to claim 10, further comprising the of varying a monitoring interval of the additional patrol operation on the basis of the refresh cycle adjusted in the refresh cycle adjusting.

18. The method for refreshing a memory according to claim 17, wherein in the monitoring interval varying, the monitoring interval is lengthened when the error frequency measured by becomes constant.

* * * * *